(12) United States Patent
Kurita et al.

(10) Patent No.: US 7,184,371 B2
(45) Date of Patent: Feb. 27, 2007

(54) OPTICAL PICKUP DRIVER HAVING PIEZOELECTRIC ELEMENTS OF DIFFERENT VOLTAGES AT START AND STEADY STATE

(75) Inventors: Kazuhito Kurita, Kanagawa (JP); Norimasa Matsuo, Kanagawa (JP)

(73) Assignee: Sony Corporation, Tokyo (JP)

( * ) Notice: Subject to any disclaimer, the term of this patent is extended or adjusted under 35 U.S.C. 154(b) by 592 days.

(21) Appl. No.: 10/467,060

(22) PCT Filed: Dec. 20, 2002

(86) PCT No.: PCT/JP02/13390

§ 371 (c)(1), (2), (4) Date: Aug. 19, 2003

(87) PCT Pub. No.: WO03/055053

PCT Pub. Date: Jul. 3, 2003

(65) Prior Publication Data
US 2004/0076089 A1   Apr. 22, 2004

(30) Foreign Application Priority Data
Dec. 21, 2001   (JP) .............................. 2001-390184

(51) Int. Cl.
*G11B 21/08* (2006.01)
(52) U.S. Cl. .................................. 369/30.27; 720/659
(58) Field of Classification Search ...................... None
See application file for complete search history.

(56) References Cited

U.S. PATENT DOCUMENTS

| | | | | |
|---|---|---|---|---|
| 5,225,941 A | * | 7/1993 | Saito et al. ................. | 359/824 |
| 5,675,444 A | * | 10/1997 | Ueyama et al. ............. | 359/824 |
| 6,188,161 B1 | * | 2/2001 | Yoshida et al. ............. | 310/328 |
| 6,941,571 B2 | * | 9/2005 | Kurita et al. ............... | 720/718 |
| 6,968,562 B2 | * | 11/2005 | Kurita et al. ............... | 720/663 |

FOREIGN PATENT DOCUMENTS

| | | |
|---|---|---|
| DE | 19806127 A1 | 8/1999 |
| EP | 0 464 764 A1 | 1/1992 |
| JP | 60-115076 | 6/1985 |
| JP | 5-184164 | 7/1993 |
| JP | 6-148497 | 5/1994 |
| JP | 7-227089 | 8/1995 |
| JP | 2001-76443 | 3/2001 |
| WO | WO01/33646 A1 | 5/2001 |

* cited by examiner

*Primary Examiner*—Tan Dinh
(74) *Attorney, Agent, or Firm*—Oblon, Spivak, McClelland, Maier & Neustadt, P.C.

(57) ABSTRACT

The present invention is directed to a drive device comprising an electromechanical transducer (25) attached to one end of a drive shaft (24) and adapted to be expanded and contracted in the axial direction of the drive shaft (24) in accordance with drive voltage to thereby allow the drive shaft (24) to undergo displacement in the axial direction thereof, and an optical pick-up (14) movably supported in the axial direction of the drive shaft (24) and moved along the drive shaft (24) as the result of the fact that the drive shaft (24) is caused to undergo displacement by the electromechanical transducer (25) to apply a drive voltage higher than that at the time of steady transfer to the electromechanical transducer (25) at the time of starting.

11 Claims, 8 Drawing Sheets

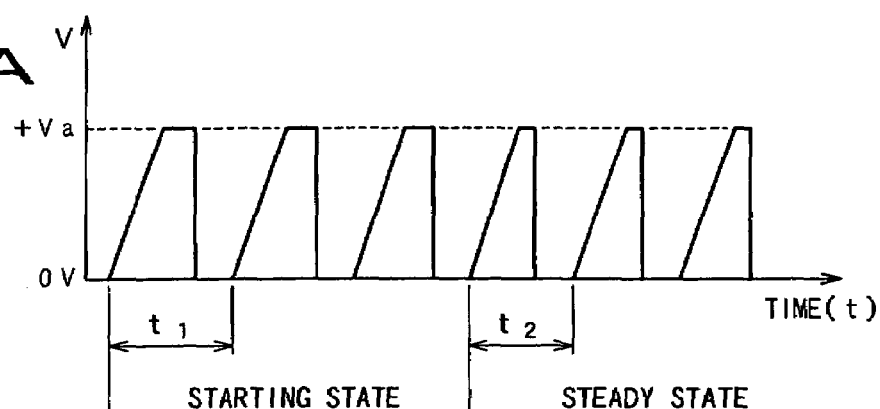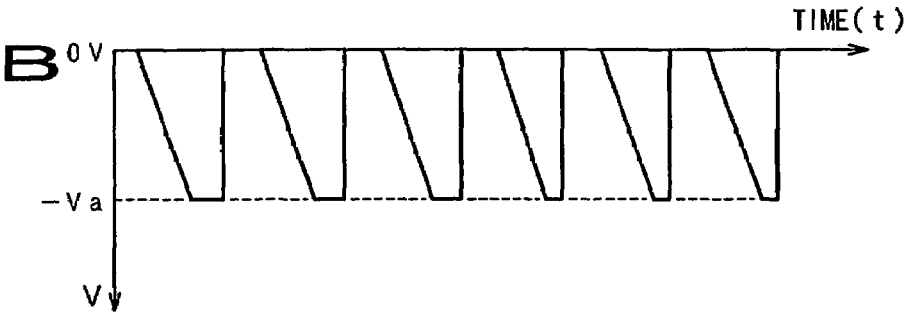

OPTICAL PICKUP DRIVER HAVING PIEZOELECTRIC ELEMENTS OF DIFFERENT VOLTAGES AT START AND STEADY STATE

BACKGROUND OF THE RELATED ART

1. Field of the Invention

The present invention relates to a drive device adapted for allowing the drive shaft to undergo displacement by using electromechanical transducing element (electromechanical transducer) so that driven body can be moved along the drive shaft, and a recording and/or reproducing apparatus using such a drive device.

The present application claims priority of Japanese Patent Application No. 2001-390184, field on Dec. 21, 2001, the entirety of which is incorporated by reference herein.

2. Description of the Related Art

Disc reproducing apparatuses using optical disc which is disc-shaped recording medium as recording medium have been used. The disc reproducing apparatus of this kind comprises a disc rotation drive mechanism for rotationally driving optical disc on which information signals are recorded, an optical pick-up for carrying out read-out of information signals recorded on the optical disc rotationally driven by this disc rotation drive mechanism, a supporting mechanism for movably supporting this optical pick-up in radial direction of the optical disc, and a drive mechanism for allowing the optical pick-up supported by this supporting mechanism to undergo feed operation in the radial direction of the optical disc. These mechanisms are assembled into base disposed within a casing constituting the apparatus body.

The disc rotation drive mechanism includes a disc table integrally attached at the drive shaft of a spindle motor. Optical disc is loaded on the disc table so that it can be rotated in one body therewith. The optical pick-up comprises a light source for emitting light beams, an object lens (objective) for converging light beams emitted from the light source onto signal recording surface of the optical disc to irradiate them, a light receiving element for detecting return light beams reflected from the signal recording surface of the optical disc, and a biaxial actuator for allowing the object lens to undergo displacement drive in a focus direction of the optical axis direction and in a tracking direction of plane surface direction perpendicular to the optical axis direction on the basis of a focus error signal and a tracking error signal which are obtained on the basis of return light beams detected by the light receiving element. The optical pick-up converges light beams emitted from the light source by the object lens, and carries out a control so that light beams thus converged are caused to be in-focus state on the signal recording surface of the optical disc and follow recording tracks of the optical disc to carry out readout of information signals recorded on the optical disc.

Such an optical pick-up is supported by the supporting mechanism. The supporting mechanism comprises a supporting base for supporting the optical pick-up, and a main shaft and a sub-shaft which movably support this supporting base in radial direction of the optical disc. The drive mechanism includes a rack member provided on the supporting base, gear mechanism composed of gears and feed screw, etc. which are meshed with this rack member, and a drive motor for rotationally driving these gear mechanisms to move the rack member in a direction along with the main shaft and the sub-shaft. When the drive mechanism is driven, the optical pick-up is moved in the radial direction of the optical disc as the result of the fact that the supporting base is moved while they are guided by the main shaft and the sub-shaft.

Since such disc reproducing apparatus requires a large number of gears at the drive mechanism, the number of parts (components) is increased so that the assembling step would become complicated. Because the number of parts is many, it is difficult to realize further miniaturization of the apparatus itself.

Meanwhile, as a drive device for driving driven body, drive devices using electromechanical transducer have been conventionally proposed and used. Such drive devices comprise a drive friction member which is caused to undergo by the electromechanical transducer, and a drive circuit for driving the electromechanical transducer. The drive device is adapted so that when a lamp voltage of a predetermined period serving as drive voltage is applied from the drive circuit to the electromechanical transducer, it allows the drive friction member to undergo displacement to move driven body attached to this drive friction member along the drive friction member. Since such drive device does not require gear, etc. at the mechanism for moving driven body, the number of parts can be reduced. Thus, miniaturization of equipment using such device can be realized.

By using such drive device using electromechanical transducer at the movement mechanism for optical pick-up of the above-described disc reproducing apparatus, the number of parts of the disc reproducing apparatus is reduced so that miniaturization of the entirety of the apparatus can be realized. In this case, by replacing either one of the main shaft and the sub-shaft which constitutes the supporting mechanism for the optical pick-up by the drive friction member for the drive circuit to allow this drive friction member to undergo displacement by the electromechanical transducer, the optical pick-up can be moved in the radial direction of the optical disc.

However, there is also the possibility that the disc recording/reproducing apparatus is not used for a long time. In such a case, there are instances where friction force with respect to the drive friction member of the optical pick-up changes, and particularly friction force becomes too large. When friction force has become large in this way, there is the possibility that the optical pick-up may not be smoothly moved in the radial direction of the optical disc at the time of starting. Particularly, with respect to portable type disc reproducing apparatus, there are instances where such apparatuses are carried to various places by user and are exposed to the environment of low temperature or high temperature, or high humidity or low humidity. When the disc reproducing apparatus is exposed to such environment, friction force with respect to drive friction member of the optical pick-up becomes too large similarly to the above-described case, so the optical pick-up cannot be smoothly moved in the radial direction of the optical disc at the time of starting.

BRIEF SUMMARY OF THE INVENTION

An object of the present invention is to provide a novel drive device and a recording and/or reproducing apparatus using such a drive device which can solve problems that conventionally proposed drive devices and disc recording and/or reproducing apparatuses using such drive devices which have been described above.

Another object of the present invention is to provide a drive device which can precisely and smoothly move driven body at all times.

A further object of the present invention is to provide a drive device which can realize power-saving while precisely and smoothly moving driven body.

A still further object of the present invention is to provide a recording and/or reproducing apparatus which can precisely and smoothly carry out movement control of the recording and/or reproducing unit by using such a drive device.

A still more further object of the present invention is to provide a recording and/or reproducing apparatus which can realize power-saving while precisely and smoothly carrying out movement control of the recording and/or reproducing unit.

The present invention is directed to a drive device comprising a drive shaft, an electromechanical transducer attached to one end of the drive shaft and adapted to be expanded and contracted in the axial direction of the drive shaft by drive voltage applied thereto to thereby allow the drive shaft to undergo displacement in the axial direction, a driven body supported in the state of friction engagement so that it can be moved in the axial direction of the drive shaft, and control means for controlling drive voltage in such a manner that speeds of expansion and contraction of the electromechanical transducer are caused to be different from each other to move the driven body in the axial direction of the drive shaft, wherein control is carried out such that drive voltage is caused to be different from that at the time of steady movement of the driven body for a predetermined time period from the time when the driven body is in stop state.

The present invention is directed to a reproducing apparatus for disc-shaped recording medium, and comprises a rotation drive mechanism for rotationally driving the disc-shaped recording medium, a reproducing unit for reproducing information signals recorded on the disc-shaped recording medium rotated by the rotation drive mechanism, a movement supporting mechanism for movably supporting the reproducing unit in the radial direction of the disc-shaped recording medium, a drive shaft disposed along the radial direction of the disc-shaped recording medium, an electromechanical transducer attached to one end of the drive shaft and adapted to be expanded and contracted in the axial direction of the drive shaft by a drive signal applied thereto to thereby allow the drive shaft to undergo displacement in the axial direction, a friction engagement member friction-engaged so that it can be moved in the axial direction of the drive shaft and attached to the reproducing unit, and a control unit for controlling drive signal so that speeds of expansion and contraction of the electromechanical transducer are caused to be different from each other to move the reproducing unit in the axial direction of the drive shaft, wherein control is conducted in such a manner that the drive signal is caused to be different from that at the steady movement time of the reproducing unit for a predetermined time period from the time when the reproducing unit is in stop state.

The reproducing apparatus according to the present invention further comprises environment measurement means for measuring environment in the vicinity of the drive shaft, wherein the control unit conducts a controls such that drive signal is caused to be different from that at the time of steady movement of the reproducing unit for a predetermined time period from the time when the reproducing unit is in stop state.

The reproducing apparatus according to the present invention further comprises time clock means, wherein the control unit conducts a control such that a drive signal is caused to be different from that at the steady movement time of the reproducing unit for a predetermined time period from the time when the reproducing unit is in stop state on the basis of power OFF time period of the apparatus measured by the time clock means.

The present invention is directed to a drive method for driven body in which a drive shaft, an electromechanical transducer attached to one end of the drive shaft and adapted to be expanded and contracted in the axial direction of the drive shaft by a drive signal applied thereto to thereby allow the drive shaft to undergo displacement in the axial direction, and a driven body supported in the friction engagement state where it can be moved in the axial direction of the drive shaft are provided to control the drive signal so that speeds of expansion and contraction of the electromechanical transducer are caused to be different from each other to move the driven body in the axial direction of the drive shaft, the drive method comprising: applying a start time drive signal different from that at steady drive time to the electromechanical transducer when the driven body is in stop state; and applying the start time drive signal to the electromechanical transducer thereafter for a predetermined time period to apply a steady drive signal to the electromechanical transducer.

The present invention is directed to a reproducing method in which a rotation drive mechanism for rotationally driving a disc-shaped recording medium, a reproducing unit for reproducing information signals recorded on the disc-shaped recording medium rotated by the rotation drive mechanism, a movement supporting mechanism for movably supporting the reproducing unit in the radial direction of the disc-shaped recording medium, a drive shaft disposed along the radial direction of the disc-shaped recording medium, an electromechanical transducer attached to one end of the drive shaft and adapted to be expanded and contracted in the axial direction of the drive shaft by a drive signal applied thereto, and a friction engagement member which is movably friction engaged in the axial direction of the drive shaft and attached to the reproducing unit are provided to control the drive signal so that speeds of expansion and contraction of the electromechanical transducer are caused to be different from each other to move the reproducing unit in the axial direction of the drive shaft to reproduce information recorded on the disc-shaped recording medium, the reproducing method: applying a start time drive signal different from that at steady transfer time to the electromechanical transducer at the time of starting of transfer of the reproducing unit; and stopping application to the electromechanical transducer of the steady drive signal in the case where the reproducing unit is transferred to the portion in the vicinity of a predetermined transfer destination.

Still further objects of the present invention and practical merits obtained by the present invention will become more apparent from the description of the embodiments which will be given below with reference to the attached drawings.

BRIEF DESCRIPTION OF THE DRAWINGS

FIGS. 4A and 4B are waveform diagrams of drive voltage applied to electromechanical transducer in the steady state, wherein FIG. 4A is a waveform diagram of drive voltage in the case where supporting base is moved in the direction indicated by arrow A in FIG. 1, and FIG. 4B is a waveform diagram of drive voltage in the case where head unit is moved in the direction indicated by arrow B in FIG. 1.

FIGS. 5A and 5B are waveform diagrams for explaining the example where drive voltage applied to electromechanical transducer at the time of staring is caused to be higher than that in the steady state, wherein FIG. 5A is a waveform diagram of drive voltage in the case where supporting base is moved in the direction indicated by arrow A in FIG. 1, and FIG. 5B is a waveform diagram of drive voltage in the case where head unit is moved in the direction indicated by arrow B in FIG. 1.

FIGS. 6A and 6B are waveform diagrams for explaining the example where period of drive voltage applied to electromechanical transducer at the time of starting is caused to be longer than that in the steady state, wherein FIG. 6A is a waveform diagram of drive voltage in the case where supporting base is moved in the direction indicated by arrow A in FIG. 1, and FIG. 6B is a waveform diagram of drive voltage in the case where head unit is moved in the direction indicated by arrow B in FIG. 1.

DETAILED DESCRIPTION OF THE INVENTION

The example where the present invention is applied to a disc recording/reproducing apparatus will now be explained with reference to the attached drawings. This disc recording/reproducing apparatus is a portable type apparatus, wherein disc cartridge is used for recording medium.

Figure 1:
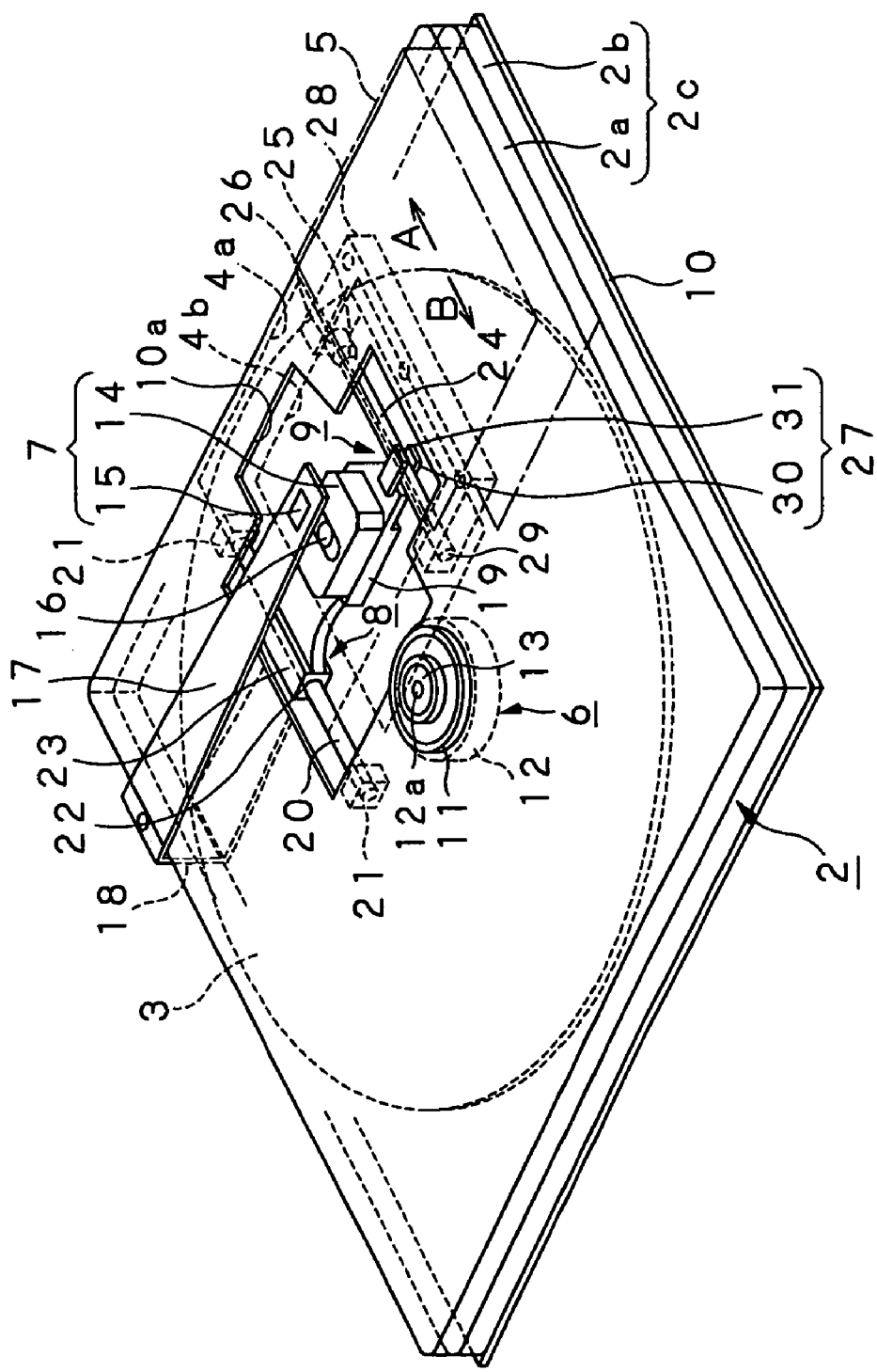
FIG. 1 is a perspective view showing a recording/reproducing apparatus to which the present invention is applied.

As shown in FIG. 1, a disc cartridge 2 used in disc recording/reproducing apparatus 1 is adapted so that a magneto-optical disc 3 as a recording medium for information signals is rotatably accommodated within a cartridge body 2c constituted by butting a pair of upper and lower halves 2a and 2b.

At the central portion of the magneto-optical disc 3, there is provided a clamping plate engaged with a disc table which constitutes disc rotation drive mechanism of the disc recording/reproducing apparatus side. The clamping plate is formed by metal, etc., and is magnetically attracted by magnet of the disc table side. Namely, the magneto-optical disc 3 is rotated in one body with the disc table as the result of the fact that the clamping plate is magnetically attracted so that it is loaded on the disc table.

At the cartridge body 2c for rotatably accommodating the magneto-optical disc 3, there are formed opening portions 4a, 4b for recording/reproduction positioned at the central portion of width direction and adapted so that a portion of the signal recording area of the magneto-optical disc 3 is faced to the external toward radial direction in a manner extending from the central portion to the front face side. These opening portions 4a, 4b are formed in rectangular shape at the position where the upper half 2a and the lower half 2b are opposite to each other. The opening portion 4a of the upper half 4a side serves to admit magnetic head which applies magnetic field to the magneto-optical disc 3 into the cartridge body 2c, and the opening portion 4b of the lower half 2b side serves to oppose the optical pick-up to the magneto-optical disc 3.

At the front face side of the cartridge body 2c, there is movably attached a shutter member 5 for opening or closing the opening portions 4a, 4b for recording/reproduction. The shutter member 5 is formed by bending thin plate member of metal, etc. so as to take substantially channel shape along outer appearance of the cartridge body 2c. The shutter portions opposite to the opening portions 4a, 4b for recording/reproduction of the shutter member 5 are formed so as to have dimensions sufficient to close these opening portions 4a, 4b. The shutter member 5 is adapted so that when the disc cartridge 2 is loaded into the disc recording/reproducing apparatus 1, it opens the opening portions 4a, 4b, and when it is placed in the storage state where it is fitted on the disc recording/reproducing apparatus 1, it closes the opening portions 4a, 4b.

At the central portion of the lower half 2b, there is provided a substantially circular central opening portion which faces the clamping plate of the magnet-optical disc 3 toward the external. When the disc cartridge 2 is loaded into the disc recording/reproducing apparatus 1, the disc table is admitted from the central opening portion to clamp the clamping plate with respect to the disc table.

Such disc cartridge 2 is loaded with respect to the disc recording/reproducing apparatus 1 with one side surface perpendicular to the front face of the cartridge body 2c being as insertion end. When the disc cartridge 2 is inserted into the disc recording/reproducing apparatus 1, the shutter member 5 moves along the front face of the cartridge body 2c in a direction in parallel to insertion direction of the disc cartridge 2 to open the opening portions 4a, 4b for recording/reproduction to permit the magneto-optical disc 3 to record or reproduce information signals.

It is to be noted that, as a recording medium accommodated within the cartridge body 2c, reproduction only optical disc, write once type optical disc in which coloring matter is used at the recording layer to permit write once operation, rewritable (erasable) type optical disc in which phase change material is used as the recording layer to permit rewrite (erasable) operation of data, and/or magnetic disc, etc. may be used in addition to the magneto-optical disc.

Then, the disc recording/reproducing apparatus 1 in which disc cartridge 2 as described above is used as recording medium will be explained.

This disc recording/reproducing apparatus 1 comprises an apparatus body provided with a loading unit in which the disc cartridge 2 is loaded, and a cover body for opening/closing the loading unit provided at the apparatus body. Within the casing which constitutes the apparatus body, a base 10 in which the loading unit where the disc cartridge 2 is loaded is constituted on one surface is disposed as shown in FIG. 1. At the base 10, although not shown, a cartridge holder which holds the disc cartridge 2 is rotatably attached. The cartridge holder is provided so that it is rotated along with a cover body which covers the apparatus body. In the disc recording/reproducing apparatus 1, when the cover body opens the loading unit, the disc cartridge 2 is inserted and held with respect to the cartridge holder to allow the cover body to undergo rotation operation in a direction to close the loading unit so that the disc cartridge 2 held at the cartridge holder is loaded into the loading unit. Thus, there results the state where recording/reproduction of information signals with respect to the magneto-optical disc 3 can be carried out. Namely, when the disc cartridge 2 is inserted into the cartridge holder, the shutter member 5 is moved in a direction to open the opening portions 4a, 4b for recording/reproduction. As a result, these opening portions 4a, 4b are opened, and are rotated toward the loading unit side along with the cartridge holder, whereby the disc table is admitted from the central opening portion provided at the lower half 2b. As the result of the fact that the disc table is admitted into the cartridge body 2c, the clamping plate is magnetically attracted by the disc table. Thus, there results the state where magnet-optical disc 3 can be rotated in one body with the disc table.

At the base 10 disposed within the casing constituting the apparatus body, as shown in FIG. 1, there are disposed a disc rotation drive mechanism 6 for rotationally driving the magneto-optical disc 3 accommodated within the cartridge body 2c, a recording/reproducing mechanism 7 for carrying out recording/reproduction of information signals with respect to the magneto-optical disc 3 rotationally driven by this disc rotation drive mechanism 6, and a movement operation mechanism 8 for movably supporting this recording/reproducing mechanism 7 in the radial direction of the magneto-optical disc 3. Further, at this movement operation mechanism 8, there is disposed an impact drive mechanism 9 for moving the recording/reproducing mechanism 7 in the radial direction of the magneto-optical disc 3.

The disc rotation drive mechanism 6 comprises a spindle motor 12 serving as drive source for rotating the magneto-optical disc 3. The spindle motor 12 is attached at the central portion of the lower surface side of the base 10 in the state where a drive shaft 12a is projected toward the upper surface side of the base 10. The disc table 11 adapted so that the magneto-optical disc 3 is loaded as the result of the fact that the clamping plate is magnetically attracted is attached to the drive shaft 12a. The magneto-optical disc 3 is loaded in the state where it can be rotated in one body with center of rotation thereof being in correspondence with the disc table as the result of the fact that a center hole formed at the central portion is engaged with the centering portion provided at center of the disc table and the clamping plate is magnetically attracted by magnet included within the disc table.

The recording/reproducing mechanism 7 disposed at the base 10 is composed of an optical pick-up 14 opposed to the signal recording area of the magneto-optical disc 3 from the opening portion 4b for recording/reproduction provided at the lower half 2b, and a magnetic head 15 admitted from the opening portion 4a for recording/reproduction provided at the upper half 2a. The optical pick-up 14 comprises a semiconductor laser as a light source which emits light beams, an object lens (objective) 16 for converging light beams emitted from the semiconductor laser, and a light detector for detecting return light beams reflected by the magneto-optical disc 3, etc. Light beams emitted from the semiconductor laser are converged by the object lens 16, and are irradiated onto the signal recording surface of the magneto-optical disc 3. The light beams irradiated onto the magneto-optical disc 3 are reflected at the signal recording surface. Return light beams reflected by the signal recording surface are incident on the optical pick-up through the object lens and are detected by light detector provided at the optical pick-up. The light beams detected by the light detector are converted into an electric signal. The electric signal thus obtained is outputted and is delivered to RF amplifier.

The optical pick-up 14 includes an object lens drive mechanism which allows the object lens 16 to undergo displacement drive in the optical axis direction. The object lens drive mechanism is a uni-axial type actuator for allowing the object lens 16 to undergo displacement only in the focus direction of the direction in parallel to the optical axis direction thereof. The object lens drive mechanism is composed of, e.g., a magnet provided at the base of the optical pick-up 14, and a drive coil provided at the lens holder of the object lens 16 in a manner opposite to the magnet, and serves to generate drive force by drive current corresponding to a focus error signal delivered to the drive coil and magnetic field that the magnet produces to allow the object lens 16 to undergo displacement in a focus direction. Namely, miniaturization of the object lens drive mechanism can be realized as compared to the conventionally used object lens drive mechanism provided with biaxial actuator for allowing the object lens to undergo drive displacement in the biaxial directions perpendicular to each other of the focus direction of the direction in parallel to the optical axis thereof and tracking direction of plane surface direction perpendicular to the optical axis.

Although the detail will be described later, the disc recording/reproducing apparatus 1 to which the present invention is applied serves to allow the optical pick-up 14 and the magnetic head 15 to undergo feed operation of the radial direction of the magneto-optical disc 3 by the impact drive mechanism 9, and to also carry out tracking control of the object lens 16.

The magnetic head 15 is attached to the front end portion of a head attachment arm 17 in a manner opposite to the object lens 16 of the optical pick-up 14 in the state where the magneto-optical disc 3 is put therebetween. The head attachment arm 17 is comprised of an elastically displacable member such as gimbal spring, etc. and serves to bias the magnetic head 15 in the direction of the magneto-optical disc 3. The magnetic head 15 is slidably in contact with the magneto-optical disc 3 only at the time of recording, and is spaced from the magneto-optical disc 3 at the time of reproduction or at the time of stand-by, etc. The operation for allowing the magnetic head 15 to become close to the magneto-optical disc 3 or to become away therefrom is carried out by head vertical movement mechanism (not shown). The optical pick-up 14 and the magnetic head 15 which constitute the recording/reproducing mechanism 7 are connected by a connecting member 18 so that they are synchronously moved in the radial direction of the magneto-optical disc 3.

Figure 2:
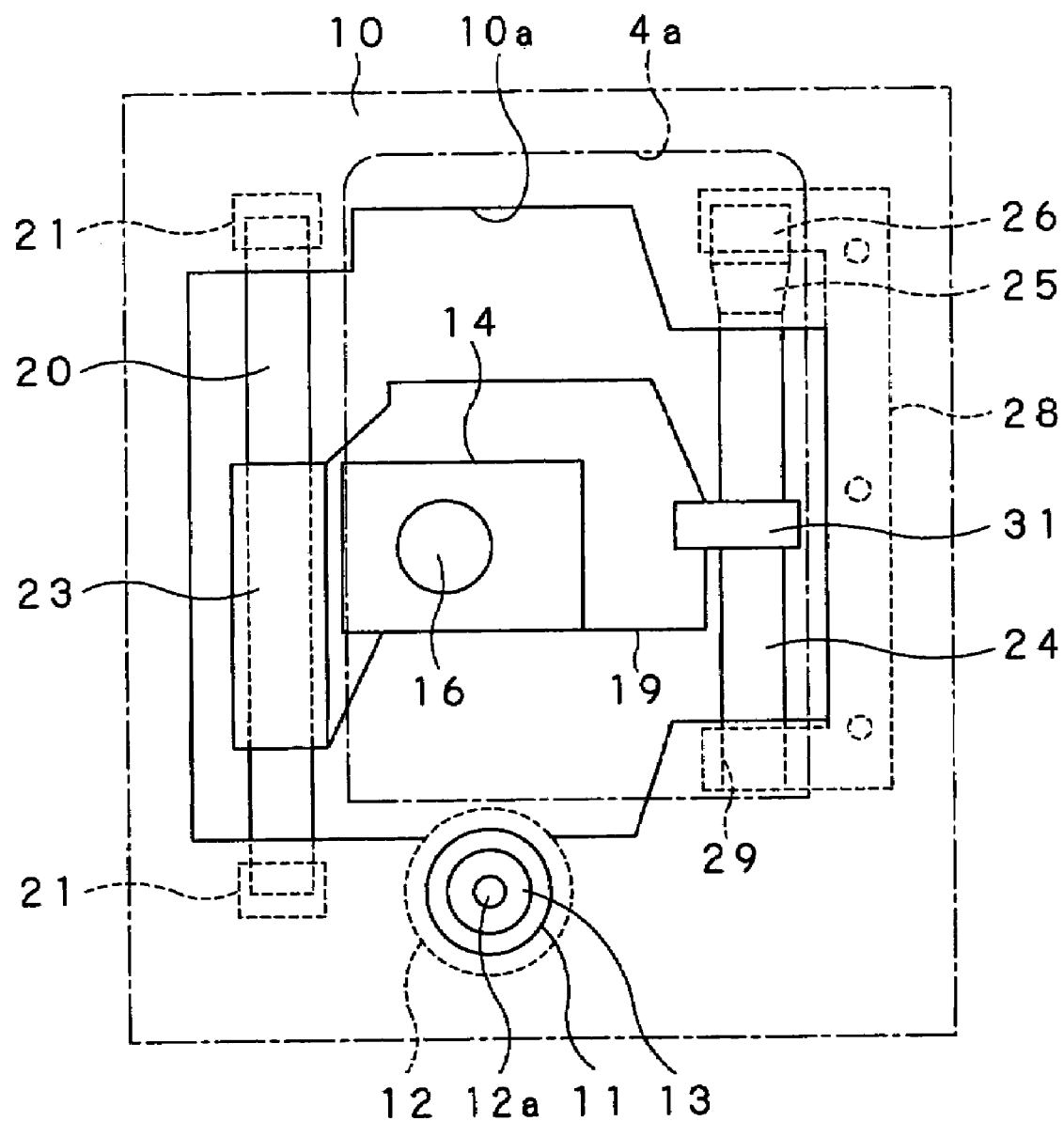
FIG. 2 is a plan view thereof.
Figure 3:
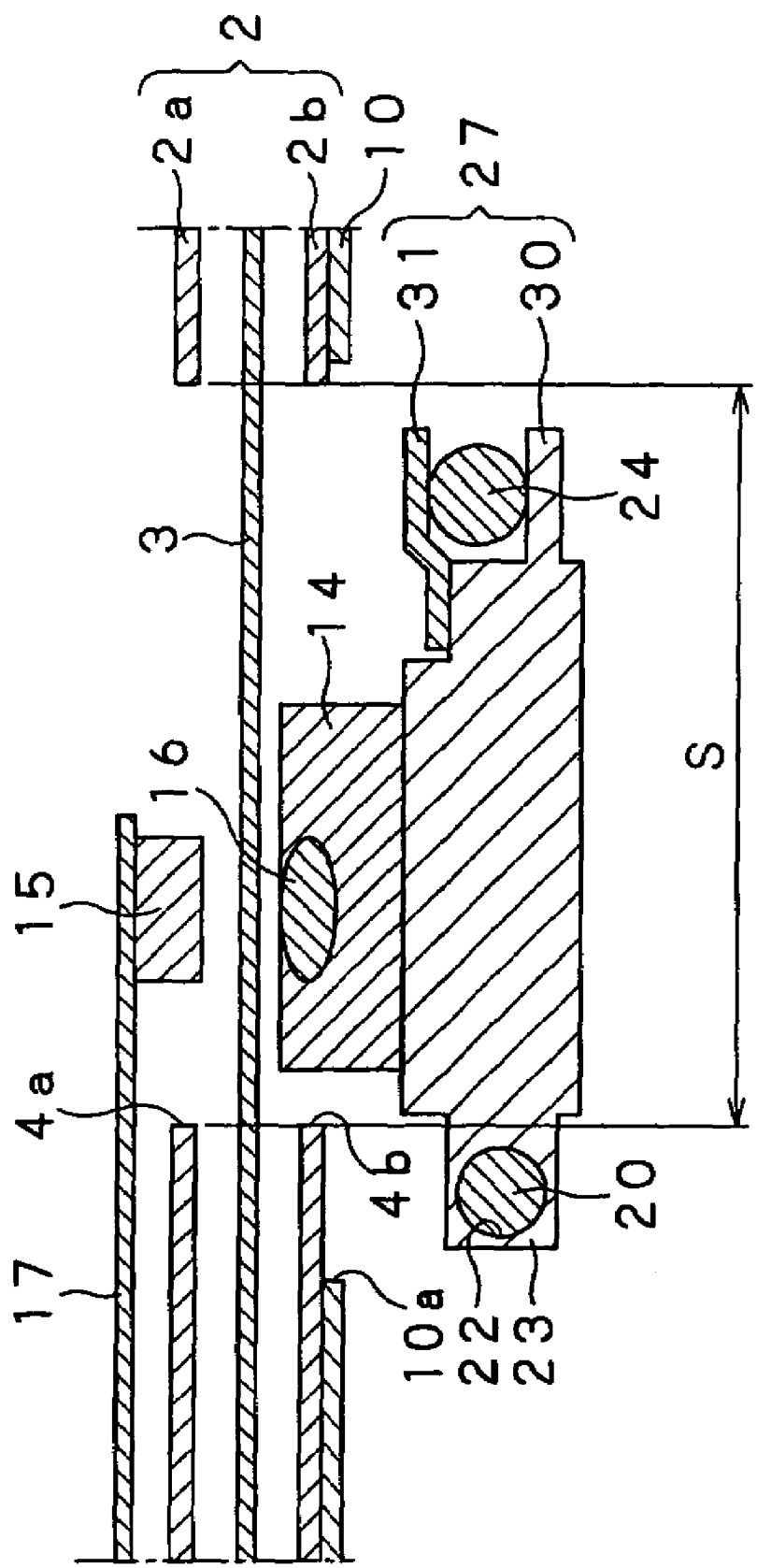
FIG. 3 is a cross sectional view showing thickness of the recording/reproducing apparatus to which the present invention is applied.

As shown in FIGS. 2 and 3, the optical pick-up 14 and the magnetic head 15 are disposed within area S where the opening portions 4a, 4b for recording/reproduction provided at the disc cartridge 2 are projected. At the base 10, there is formed an opening portion 10a corresponding to the opening portion 4a for recording/reproduction.

As shown in FIGS. 1 and 2, the movement operation mechanism 8 for allowing the recording/reproducing mechanism 7 to undergo movement operation in the radial direction of the magneto-optical disc 3 includes a supporting base 19 for supporting the optical pick-up 14 and for supporting the magnetic head 15 attached to the front end portion of the head attachment arm 17 through the connecting member 18, and a guide shaft 20 for movably supporting this supporting base 19 in the radial direction of the magneto-optical disc 3.

The supporting base 19 is disposed so that the optical pick-up 14 is faced from the opening portion 10a formed at the base 10 toward the external. The guide shaft 20 is disposed in parallel to the radial direction of the magneto-optical disc 3, and is adapted so that both end portions thereof are fixed and supported by a pair of supporting members 21, 21 provided around the opening portion 10a of the base 10. At the supporting base 19, there is integrally formed a supporting portion 23 in which a guide hole 22 through which the guide shaft 20 is inserted is bored.

The impact drive mechanism 9 includes a drive shaft 24 disposed in parallel to the guide shaft 20, i.e., in parallel to the radial direction of the optical disc, an electromechanical transducer 25 attached to one end of this drive shaft 24, a fixing portion 26 for fixing this electromechanical transducer 25, and a connecting portion 27 slidably supported in the axial direction of the drive shaft 24 and serving to connect the supporting base 19 and the drive shaft 24.

The drive shaft 24 has a length sufficient to move the supporting base 19 in a manner extending over inner and outer circumferences of the magneto-optical disc 3, and constitutes a drive friction member. An electromechanical transducer 25 is attached to one end of the drive shaft 24. The electromechanical transducer 25 is piezo element or piezoelectric element, etc., and carry out expansion/contraction displacement in which speeds of expansion and contraction are different in the axial direction of the drive shaft 24 in accordance with drive voltage applied by drive circuit (not shown) to vibrate the drive shaft 24 in the axial direction. The fixing portion 26 is adapted so that one end of end portion of the electromechanical transducer 25 is attached, and functions also as balancer at the time of vibration.

The impact drive mechanism 9 is supported by a bracket 28 attached to the opposite side surface of the surface opposite to the disc cartridge 2 of the base 10 by screw-fixing, etc. The fixing portion 26 is attached to one end of the bracket 28, and a supporting hole 29 which supports the other end of the drive shaft 24 is provided at the other end thereof, wherein the other end of the drive shaft 24 is engaged therewith so that it can be vibrated in the axial direction. Namely, the drive shaft 24 is supported by the bracket 28 so that it can be moved in the axial direction by displacement of the electromechanical transducer 25.

The connecting portion 27 is composed of a first connecting piece 30 and a second connecting piece 31 which are integrally provided at the supporting base 19. The first connecting piece 30 is formed in a projected manner from the end portion of the side opposite to the supporting portion 23 of the supporting base 19 toward the drive shaft 24. The second connecting piece 31 is comprised of elastically dispacable member such as leaf spring, etc., and is attached by screw-fixing, etc. in the state where it is cantilever-supported by the supporting base 19. These first and second connecting pieces 30 and 31 are disposed in a manner opposite to each other, and are adapted so that the drive shaft 24 is put therebetween so that it is movably supported in the axial direction of the drive shaft 24.

Accordingly, as the result of the fact that the guide shaft 20 is inserted into the guide hole 22 of the supporting portion 23 and the connecting portion 27 is slidably supported in the axial direction of the drive shaft 24, the supporting base 19 is movably supported in the axial direction of the guide shaft 20 and the drive shaft 24, i.e., in the radial direction of the magneto-optical disc 3.

The impact drive mechanism 9 constituted in this way allows the electromechanical transducer 25 to undergo displacement in the axial direction of the drive shaft 24 while expanding or contracting the electromechanical transducer 25 in accordance with drive voltage serving as a drive signal of this electromechanical transducer 25 to thereby slide the connecting portion 27 in the axial direction of the drive shaft 24. Thus, the supporting base 19 which supports the optical pick-up 14 and the magnetic head 15 can be linearly driven in the radial direction of the magneto-optical disc 3. In practical sense, at the electromechanical transducer 25, as shown in FIGS. 4 to 6, there is applied a substantially saw-tooth shaped drive voltage such that respective pulses linearly and gently rise at the inclination portion of rising as a drive signal from the starting time such as movement start time, etc. of the optical pick-up 14 to the steady state during recording/reproducing operation, and then hold a fixed voltage for a predetermined time period, and then rapidly drops at the vertical portion of falling.

Figure 4A:
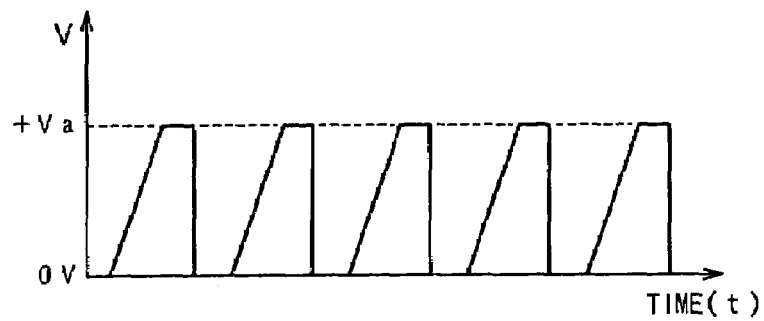
Figure 4B:
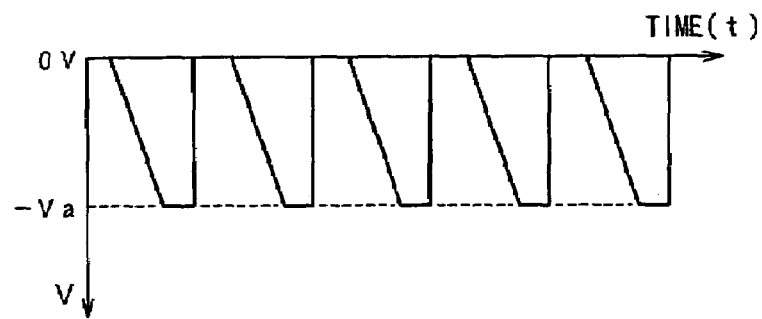

In this impact drive mechanism 9, at the time of recording/reproduction, i.e., in the steady state, in the case where the supporting base 19 is linearly driven in the direction indicated by arrow A in FIG. 1, drive voltage V of waveform as shown in FIG. 4A is applied. Namely, when drive voltage V generally and linearly rises to a predetermined voltage Va at the time of rising, the electromechanical transducer 25 gradually expands. In a manner interlocking therewith, the drive shaft 24 gently moves in the direction indicated by arrow A in FIG. 1. At this time, the supporting base 19 is held at the drive shaft 24 by friction force worked between the connecting portion 27 and the drive shaft 24, and is moved in the direction indicated by arrow A in FIG. 1 along with the drive shaft 24. On the other hand, when drive voltage V is sharply dropped down to 0 V at falling, the electromechanical transducer 25 is rapidly contracted. In a manner interlocking therewith, the drive shaft 24 is rapidly moved in the direction indicated by arrow B in FIG. 1. At this time, at the connecting portion 27, slide against friction force is produced by inertia between the connecting portion 27 and the drive shaft 24. Thus, only the drive shaft 24 is moved in the direction indicated by arrow B in FIG. 1. As a result, the supporting base 19 is moved in the direction indicated by arrow A in FIG. 1 with respect to the drive shaft 24. This impact drive mechanism 9 repeatedly applies drive voltage Va shown in FIG. 4A to the electromechanical transducer 25, thereby making it possible to continuously move the supporting base 19 connected to the drive shaft 24 through the connecting portion 27 in the direction indicated by arrow A in FIG. 1 with respect to the drive shaft 24.

In the case where the impact drive mechanism 9 linearly drives the supporting base 19 in the direction indicated by arrow B in FIG. 1 in the steady state, drive voltage V of waveform opposite to the drive voltage V of the waveform shown in FIG. 4A is applied to the electromechanical transducer 25. Namely, when drive voltage V is gently and linearly dropped down to a predetermined voltage −Va at rising, the electromechanical transducer 25 is gently contracted. In a manner interlocking therewith, the drive shaft 24 is gently moved in the direction indicated by arrow B in FIG. 1. At this time, the supporting base 19 is held at the drive shaft 24 by friction force worked between the connecting portion 27 and the drive shaft 24, and is moved in the direction indicated by arrow B in FIG. 1 along with the drive shaft 24. On the other hand, when drive voltage V is rapidly raised substantially vertically up to 0 V at rising, the electromechanical transducer 25 is rapidly expanded. In a manner interlocking therewith, the drive shaft 24 is rapidly moved in the direction indicated by arrow A in FIG. 1. At this time, at the connecting portion 27, slide is produced by inertia between the connecting portion 27 and the drive shaft 24. Thus, only the drive shaft 24 is moved in the direction indicated by arrow A in FIG. 1. As a result, the supporting base 19 is moved in the direction indicated by arrow B in FIG. 1 with respect to the drive shaft 24. This impact drive mechanism 9 repeatedly applies drive voltage shown in FIG. 4B to the electromechanical transducer 25, thereby making it possible to continuously move the connecting portion 27 in the direction indicated by arrow B in FIG. 1 with respect to the drive shaft 24.

Meanwhile, there are instances where the disc recording/reproducing apparatus 1 to which the present invention is applied is not used for a long time. This recording/reproducing apparatus 1 is caused to be compact for portable use. Such apparatus is carried to various places by user, and is used under various environments. Particularly, there are instances where such apparatus is used under the environment of low temperature or high temperature, or high humidity or low humidity. When the apparatus is exposed to such environment, friction force becomes too large at the time of starting, i.e., at the time of movement start of the optical pick-up 14, so the supporting base 19 cannot be smoothly moved with respect to the drive shaft 24 as in the case of the steady state. In view of the above, at the impact drive mechanism 9, voltage Vb higher than voltage Va in the steady state is applied at the time of starting to drive the electromechanical transducer 25. The case where the supporting base 19 is linearly driven in the direction indicated by arrow A in FIG. 1 will be explained with reference to FIG. 5A. When drive voltage is gently and linearly raised up to a predetermined voltage Vb higher than voltage Va applied in the steady state at rising, the electromechanical transducer 25 is gently expanded. In a manner interlocking therewith, the drive shaft 24 is gently moved in the direction indicated by arrow A in FIG. 1. At this time, the supporting base 19 is held at the drive shaft 24 by friction force worked between the connecting portion 27 and the drive shaft 24, and is moved in the direction indicated by arrow A in FIG. 1 along with the drive shaft 24. On the other hand, when drive voltage is sharply dropped substantially vertically down to 0 V at falling, the electromechanical transducer 25 is rapidly contracted. In a manner interlocking therewith, the drive shaft 24 is rapidly moved in the direction indicated by arrow B in FIG. 1. At this time, at the connecting portion 27, slide against friction force is produced by inertia between the connecting portion 27 and the drive shaft 24. Thus, only the drive shaft 24 is moved in the direction indicated by arrow B in FIG. 1. As a result, the supporting base 19 is moved in the direction indicated by arrow A in FIG. 1 with respect to the drive shaft 24. Until movement of the supporting base 19 is repeated so that friction force becomes equal to the same level as that in the steady state, this impact drive mechanism 9 repeatedly applies drive voltage Vb shown in FIG. 5A to the electromechanical transducer 25 to thereby continuously move the supporting base 19 connected to the drive shaft 24 through the connecting portion 27 in the direction indicated by arrow A in FIG. 1 with respect to the drive shaft 24.

Figure 5A:
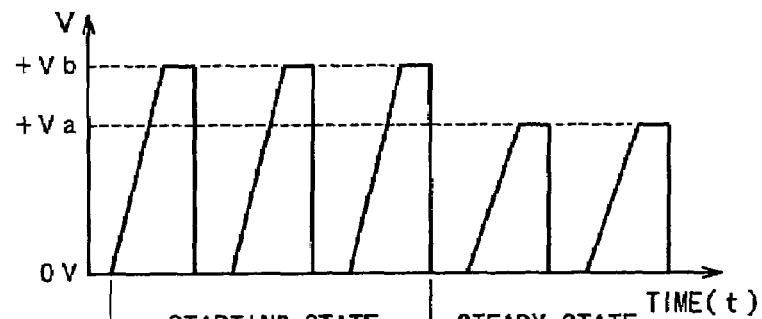
Figure 5B:
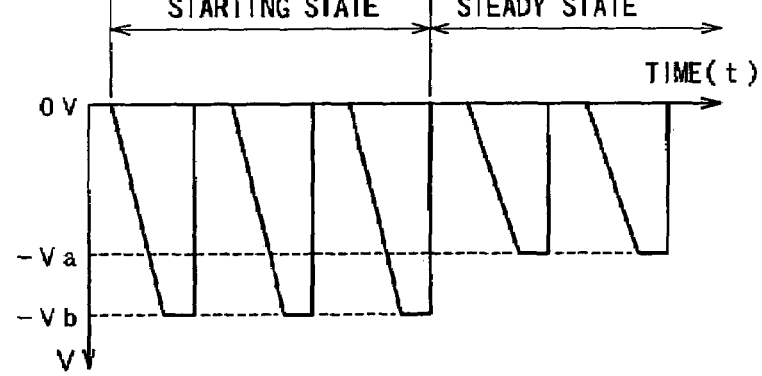

Then, the case where the supporting base 19 is linearly driven in the direction indicated by arrow B in FIG. 1 will be explained with reference to FIG. 5B. A drive voltage V of waveform opposite to drive voltage V of FIG. 5A is applied to the electromechanical transducer 25. Namely, when drive voltage V is gently and linearly dropped down to a predetermined voltage −Vb at rising, the electromechanical transducer 25 is gently contracted. In a manner interlocking therewith, the drive shaft 24 is gently moved in the direction indicated by arrow B in FIG. 1. At this time, the supporting base 19 is held at the drive shaft 24 by friction force worked between the connecting portion 27 and the drive shaft 24, and is moved in the direction indicated by arrow B in FIG. 1 along with the drive shaft 24. On the other hand, when drive voltage V is sharply raised substantially vertically up to 0 V at rising, the electromechanical transducer 25 is rapidly expanded. In a manner interlocking therewith, the drive shaft 24 is rapidly moved in the direction indicated by arrow A in FIG. 1. At this time, at the connecting portion 27, slide is produced by inertia between the connecting portion 27 and the drive shaft 24. Thus, only the drive shaft 24 is moved in the direction indicated by arrow A in FIG. 1. As a result, the supporting base 19 is moved in the direction indicated by arrow B in FIG. 1 with respect to the drive shaft 24. Until movement of the supporting base 19 is repeated so that friction force becomes the same level as that in the steady state, this impact drive mechanism 9 repeatedly applies drive voltage −Vb shown in FIG. 5B to the electromechanical transducer 25 to thereby continuously move the supporting base 19 connected to the drive shaft 24 through the connecting portion 27 in the direction indicated by arrow B in FIG. 1 with respect to the drive shaft 24.

In the method as described above, drive voltage Vb of which absolute value is higher than that in the steady state is applied to the electromechanical transducer 25 to thereby have ability to enlarge displacement quantity of the drive shaft 24, i.e., increase drive force for moving the supporting base 19. Thus, even when friction force is large at the time of starting, etc., it is possible to smoothly move the supporting base 19 attached to the optical pick-up 14 or the magnetic head 15. This control is carried out only at the time of starting, and steady voltage Va lower than Vb is applied to the electromechanical transducer 25 at a fixed period in the steady state. From this fact, it is possible to suppress power consumption as minimum as possible.

While the method of allowing drive voltage to be larger than in the steady state when friction force is large has been explained above, there may be employed, in addition to the above, an approach to allow period where drive voltage is applied to be longer than that in the steady state. The case where the supporting base 19 is linearly driven in the direction indicated by arrow A in FIG. 1 will be explained with reference to FIG. 6A. When drive voltage V is gently and linearly raised up to a predetermined voltage Va at rising, the electromechanical transducer 25 is gently expanded. In a manner interlocking therewith, the drive shaft 24 is gently moved in the direction indicated by arrow A in FIG. 1. At this time, the supporting base 19 is held at the drive shaft 24 by friction force worked between the connecting portion 27 and the drive shaft 24, and is moved in the direction indicated by the arrow A in FIG. 1 along with the drive shaft 24. On the other hand, when drive voltage V is sharply dropped substantially vertically at rising, the electromechanical transducer 25 is rapidly contracted. In a manner interlocking therewith, the drive shaft 24 is rapidly moved in the direction indicated by arrow B in FIG. 1. As a result, the supporting base 19 is moved in the direction indicated by arrow A in FIG. 1 with respect to the drive shaft 24. Until movement of the supporting base 19 is repeated so that friction force becomes the same level as that in the steady state, this impact drive mechanism 9 repeatedly applies drive voltage Va shown in FIG. 6A to the electromechanical transducer 25 at period t1 longer than period t2 in the steady state to thereby continuously move the supporting base 19 connected to the drive shaft 24 through the connecting portion 27 in the direction indicated by arrow A in FIG. 1 with respect to the drive shaft 24.

Moreover, the case where the supporting base 19 is linearly driven in the direction indicated by arrow B in FIG. 1 will be explained with reference to FIG. 6B. A drive voltage of waveform opposite to drive voltage of FIG. 6A is applied to the electromechanical transducer 25. Namely, when drive voltage V is gently and linearly dropped down to a predetermined voltage −Va at the time of rising, the electromechanical transducer 25 is gently contracted. In a manner interlocking therewith, the drive shaft 24 is gently moved in the direction indicated by arrow B in FIG. 1. At this time, the supporting base 19 is held at the drive shaft 24 by friction force worked between the connecting portion 27 and the drive shaft 24, and is moved in the direction indicated by arrow B in FIG. 1 along with the drive shaft 24. On the other hand, when drive voltage is sharply raised substantially vertically up to 0V at rising, the electromechanical transducer 25 is rapidly expanded. In a manner interlocking therewith, the drive shaft 24 is rapidly moved in the direction indicated by arrow A in FIG. 1. At this time, at the connecting portion 27, slide is produced by inertia between the connecting portion 27 and the drive shaft 24. Thus, only the drive shaft 24 is moved in the direction indicated by arrow A in FIG. 1. As a result, the supporting base 19 is moved in the direction indicated by arrow B in FIG. 1 with respect to the drive shaft 24. Until movement of the supporting base 19 is repeated so that friction force becomes the same level as that in the steady state, this impact drive mechanism 9 repeatedly applies drive voltage −Va shown in FIG. 6B to the electromechanical transducer 25 at period t1 longer than period t2 in the steady state to thereby move the supporting base 19 connected to the drive shaft 24 through the connecting portion 27 in the direction indicated by arrow B in FIG. 1 with respect to the drive shaft 24.

In the above-described method, period where drive voltage is applied is caused to be period t1 longer than period t2 in the steady state at the time of starting and frequency is lowered, thereby making it possible to enlarge displacement quantity of the drive shaft 24, i.e., to increase drive force for moving the supporting base 19. Thus, even when friction force is large at the time of starting, etc. it is possible to smoothly move the supporting base 19 where the optical pick-up 14 and/or the magnetic head 15 are attached.

As described above, when friction force is large at the time of starting, etc., drive voltage V applied to the electromechanical transducer 25 is raised, or period is elongated to thereby increase movement quantity of the supporting base 19, i.e., to increase drive force for driving the supporting base 19, thereby making it possible to smoothly move the supporting base 19.

Meanwhile, switching between control at the time of starting and control at the time of steady state is carried out by detecting position information of the optical pick-up 14 when drive voltage V is applied to the electromechanical transducer 25 a predetermined number of times, e.g., twice, or three times. For example, when address information of the magneto-optical disc is used, change quantity of address information when drive voltage is applied to the electromechanical transducer 25 a predetermined number of times at the time of steady state is used as threshold value. When change quantity of address information when drive voltage V is applied to the electromechanical transducer 25 a predetermined number of times is smaller than this threshold value, control at the time of starting is conducted, i.e., drive voltage V is raised or period is elongated. When such change quantity is the same as threshold value, it is sufficient to carry out control at the time of steady state. Moreover, when tracking error signal is used, change quantity of tracking error signal when drive voltage V is applied to the electromechanical transducer 25 a predetermined number of times at the time of steady state is used as threshold value. When change quantity of tracking error signal when drive voltage V is applied to the electromechanical transducer 25 a predetermined number of times is smaller than this threshold value, control at the time of starting is conducted, i.e., drive voltage is raised or period is elongated. When such change quantity is the same as the threshold value, it is sufficient to carry out control at the time of steady state. Of course, in addition to the above, position of the supporting base 19 may be detected by mechanical switch to carry out such switching in accordance with this result.

In accordance with the impact drive mechanism 9 as described above, friction force worked between the drive shaft 24 and the connecting portion 27, and/or elastic force of the second connecting piece 31 with respect to the drive shaft 24 are adjusted, thereby making it possible to hold the supporting base 19 in stable state at an arbitrary position in movement direction by friction force worked between the drive shaft 24 and the connecting portion even at the time of non-drive state. At this impact drive mechanism 9, there is no backlash taking place when gear train is used as in the case of the conventional drive apparatus, and drive control at high resolution of the nm order can be carried out. Thus, soundless drive in ultrasonic wave region move than 20 kHz can be carried out. Further, as shown in FIGS. 2 and 3, this impact drive mechanism 9 can be miniaturized to much degree as compared to the mechanism for converting rotational drive by drive motor into linear drive through a group of gears and rack member as in the conventional drive device, and can be disposed along with the above-described recording/reproducing mechanism 7 within the area S where the opening portions 4a, 4b for recording/reproduction is projected of the disc cartridge 2.

Then, the circuit configuration of the disc recording/reproducing apparatus 1 according to the present invention constituted as described above will be explained with reference to FIG. 7.

Figure 7:
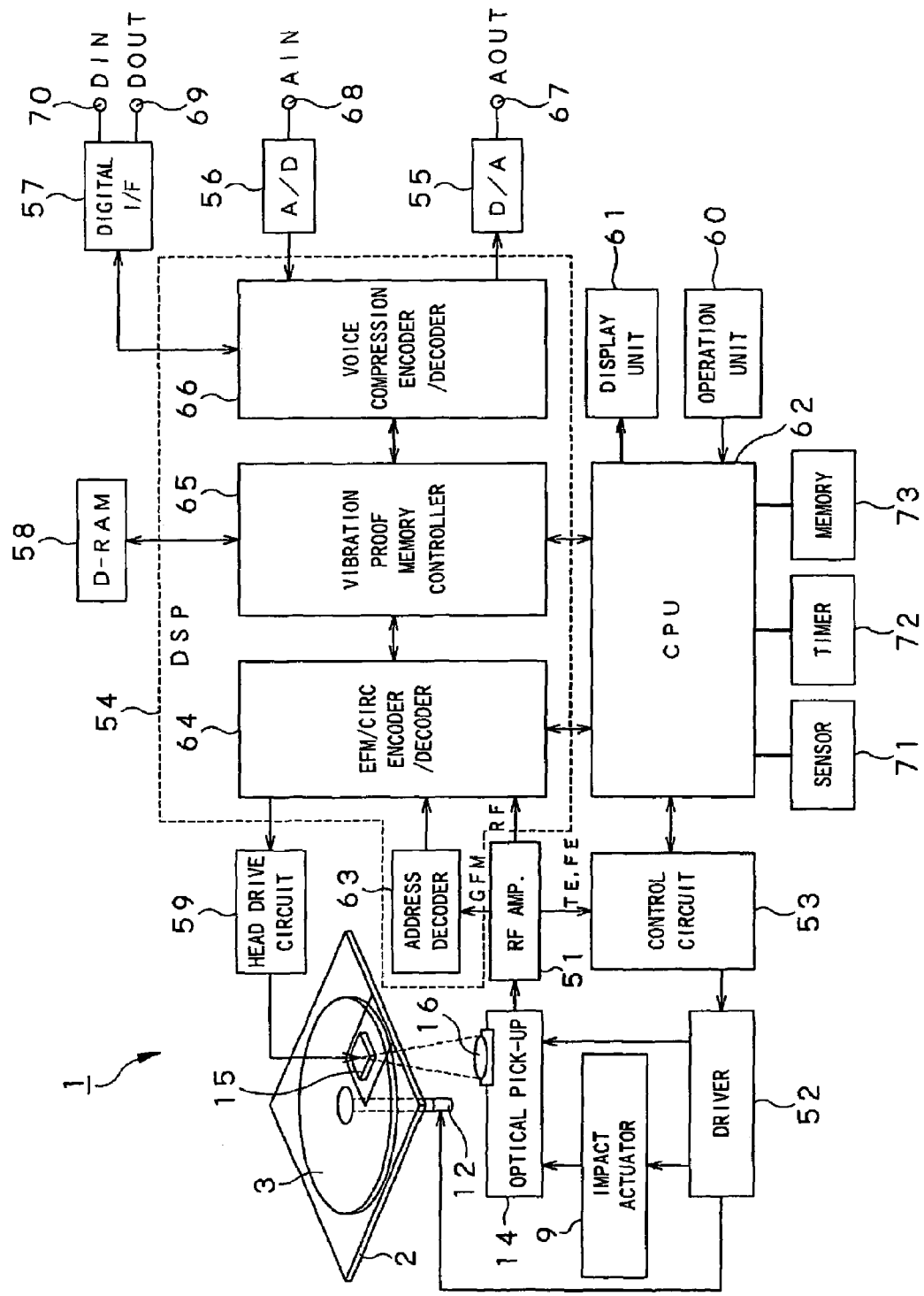
FIG. 7 is a block diagram showing circuit configuration of a disc recording/reproducing apparatus to which the present invention is applied.

The disc recording/reproducing apparatus 1 according to the present invention comprises, as shown in FIG. 7, a RF amplifier 51 for generating various signals such as RF signal, etc. by output from the optical pick-up 14, a driver 52 for driving the optical pick-up 14 and the spindle motor 12, etc., a control circuit unit 53 for generating servo signal of the spindle motor 12, etc., a Digital Signal Processor (hereinafter referred to as DSP) 54 for carrying out digital signal processing, a D/A converter 55 for converting a digital signal into an analog signal, an A/D converter 56 for converting an analog signal into a digital signal, a digital interface 57 for carrying out input/output of digital signal, a buffer memory 58 constituted by D-RAM (Dynamic Random Access Memory), a head drive circuit 59 for carrying out drive control of the magnetic head 15, an operation unit 60 that user carries out operation, a display unit 61 for carrying out display for user, and a system controller 62 constituted by CPU which controls the entirety of the system.

The RF amplifier 51 generates a RF signal, a focus error signal and a tracking error signal on the basis of an output signal from light detector constituting the optical pick-up 14. Moreover, the RF amplifier 51 extracts groove information serving as absolute position information recorded as wobbling groove at the magneto-optical disc 3. For example, focus error signal is generated by the astigmatism method, etc., and tracking error signal is generated by the three beam method or the push-pull method, etc. The RF amplifier 51 outputs RF signal and groove information to the DSP 54 to output a focus error signal and a tracking error signal to the control circuit unit 53.

The control circuit unit 53 carries out focusing servo control based on focus error signal delivered from the RF amplifier 51, servo control of the impact drive mechanism 9 based on tracking error signal and track jump command or access command, etc. from the system controller 62, and the spindle motor 12 servo control, etc.

In practical sense, the control circuit unit 53 detects error quantity with respect to target value in the focus direction from the focus error signal delivered from the RF amplifier 51 to output servo signal based on this detection result to the driver 52. The driver 52 outputs drive voltage corresponding to this servo signal to object lens drive mechanism of the optical pick-up 14 to thereby allow the object lens 16 to undergo drive displacement in the focus direction which is permitted to be in contact with the signal recording surface of the magneto-optical disc 3 or to be away therefrom.

The control circuit unit 53 carries out servo control of the impact drive mechanism 9 based on tracking error signal, and track jump command or access command, etc. from the system controller 62. When this is explained with reference to FIG. 8, a servo circuit 80 of the impact drive mechanism 9 comprises an A/D converter 81 for converting tracking error signal inputted from the RF amplifier 51 into digital signal, a Low Pass filter (hereinafter referred to as LPF) 82 for carrying out phase compensation of tracking error signal and for removing high frequency component, i.e., noise, a sled signal generator 83 for generating a sled signal for carrying out feed operation of the optical pick-up 14 in the radial direction of the magneto-optical disc when track jump, etc. is carried out, an adder 84 for adding sled signal to tracking error signal, and a modulator 85 for generating a drive signal applied to the electromechanical transducer 25 which constitutes the impact drive mechanism 9.

When the servo circuit 80 carries out ordinary control where track jump is not carried out, sled signal that the sled signal generator 83 generates is equal to zero. When tracking error signal is inputted from the RF amplifier 51, the A/D converter 81 converts tracking error signal from analog signal to digital signal to output this digital signal to the LPF 82. The LPF 82 removes noise of high frequency component of tracking error signal and carries out phase compensation to output the signal thus obtained to the modulator 85 through the adder 84. Further, the modulator 85 generates a drive signal of the impact drive mechanism 9 such that a tracking error signal from which the high frequency component has been removed becomes equal to zero to output this drive signal to the driver 52.

When the servo circuit 80 carries out a control such as track jump, etc., track jump signal is inputted from the system controller 62 to the sled signal generator 83. In accordance with this input, the sled signal generator 83 generates sled signal Vd. Further, when tracking error signal is inputted from the RF amplifier 51, the A/D converter 81 converts tracking error signal from analog signal to digital signal to output this digital signal to the LPF 82. The LPF 82 removes noise of high frequency component of tracking error signal and carries out phase compensation to output the tracking error signal thus obtained to the adder 84. The adder 84 adds sled signal Vd to the tracking error signal from which high frequency component has been removed to output the signal thus obtained to the modulator 85. The modulator 85 generates, on the basis of sum signal in which sled signal Vd has been added to the tracking error signal, a drive signal for the impact drive mechanism 9 such that the tracking error signal becomes equal to zero to output this drive signal to the driver 52. Thus, the impact drive mechanism 9 can carry out fine tracking control of the object lens 16 and rough feed operation in the radial direction of the magneto-optical disc 3 with respect to the optical pick-up 14.

The modulator 85 is supplied with a switching signal from the system controller 62 when switching of drive voltage or period at the time of starting and that at the time of steady state is carried out, and carries out switching in accordance with this switching signal.

The control circuit unit 53 drives the spindle motor 12 at constant angular velocity or constant linear velocity through the driver 52, and delivers a control signal based on command from the system controller 62 to the driver 52 to thereby carry out drive or stop of the spindle motor 12. This control circuit unit 53 delivers a control signal based on command from the system controller 62 to the driver 52 to thereby carry out drive control such as turning ON or turning OFF and laser output, etc. of semiconductor laser in the optical pick-up 14.

The DSP 54 includes an address decoder 63 supplied with groove information from the RF amplifier 51. The address decoder 63 decodes the groove information delivered from the RF amplifier 51 to extract address information. This address information is delivered to the system controller 62, and is used for various drive controls. In addition, the DSP 54 includes an EFM/CIRC encoder/decoder 64, a memory controller 65 for vibration proof, and a voice compression encoder/decoder 66.

At the time of reproduction, a RF signal is delivered from the RF amplifier 51 to the EFM/CIRC encoder/decoder 64. Decode processing such as EFM (Eight to Fourteen Modulation), and CIRC (Cross Interleave Reed-Solomon Code) relating to error correction are carried out with respect to this RF signal. Thus, data in compressed state is extracted, and this extracted data signal is written into the buffer memory 58 by the memory controller 65 for vibration-proof. Further, the data signal which has been temporarily written into the buffer memory 58 is read out every predetermined data unit, and is delivered to the voice compression encoder/decoder 66. Decode processing by ATRAC (Adaptive Transform Acoustic Coding) is carried out with respect to this data. Thus, expansion into digital audio signal is carried out This digital audio signal is converted into analog audio signal by the D/A converter 55, and is then outputted from an audio output terminal 67. This digital audio signal may be also directly outputted from a digital output terminal 69 through the digital interface 57.

At the time of recording, analog audio signal which has been inputted from an audio input terminal 68 is converted into a digital audio signal by the A/D converter 56, and is then delivered to the voice compression encoder/decoder 66. Moreover, in this recording/reproducing apparatus 1, digital audio signal may be also directly inputted from a digital input terminal 70 through the digital interface 57. In the DSP 54, digital audio signal which has been delivered to the voice compression encoder/decoder 66 is caused to be compressed data as the result of the fact that encode processing by ATRAC is carried out, and is written into the buffer memory 58 by the memory controller 66 for vibration proof. Further, the compressed data which has been temporarily written into the buffer memory 58 is read out every predetermined data unit, and is delivered to the EFM/CIRC encoder/decoder 64. Encode processing such as EFM and CIRC relating to error correction, etc. are carried out with respect to this data signal, and the data signal thus processed is then delivered to the head drive circuit 59.

The head drive circuit 59 allows the magnetic head 15 to produce an external magnetic field modulated in accordance with recording data in which encode processing has been carried out. At this time, the head vertical movement mechanism allows the magnetic head 15 to come into contact with the surface of the opposite side with respect to the surface opposite to the optical pick-up 14 of the magneto-optical disc 3, or becomes close thereto on the basis of command from the system controller 62. The magneto-optical disc 3 is heated so as to have more than Curie temperature as the result of the fact that light beams are irradiated by the optical pick-up 14, and magnetic field is applied by the magnetic head 15. Thus, data is recorded.

The operation unit 60 is composed of operation switches and/or operation buttons, etc., and delivers, to the system controller 62, operation information according to recording or reproducing operation, e.g., reproduction (playback), recording, temporary stop, stop, fast feed, fast return and head research, etc. and/or operation information according to play mode such as ordinary reproduction, program reproduction and shuffle reproduction, etc.

The display unit 61 is comprised of liquid crystal display panel, etc., and diplays operation mode state, track No., recording time or reproduction time and/or edit operation state of the magneto-optical disc 3 at the time of recording or reproduction, etc.

A sensor 71 is used for measuring the environmental condition where the recording/reproducing apparatus 1 according to the present invention is exposed, and is a sensor for measuring, e.g., temperature or humidity.

A timer 72 serves to carry out count operation of time, and has, e.g., sec., min., hour and calendar functions. The timer 72 is utilized for calculating time during which the apparatus is operative, or time period during which the apparatus is not used, etc.

A memory 73 is adapted so that various information are held, and at least a portion of information is held even in the state where power supply of the apparatus is not turned ON, i.e., time period of power OFF.

The system controller 62 executes operation control of respective portions corresponding to operation information delivered from the operation unit 60. As shown in FIGS. 5 and 6, e.g., the system controller 62 conducts a control for carrying out switching between control of the impact drive mechanism 9 at the time of starting and control at the time of steady state of access of the magneto-optical disc 3. The case where address information recorded on the magneto-optical disc 3 is used to carry out this switching will be explained. The system controller 62 preserves change quantity of address when drive voltage is applied to the electromechanical transducer 25 a predetermined number of times (e.g., twice or three times) at the time of steady state as threshold value in the memory 73. The system controller 62 is supplied with address information from the address decoder 63 at the time of starting to detect change quantity of address information when drive voltage is applied to the electromechanical transducer 25 a predetermined number of times. The system controller 62 compares change quantity of address information when drive voltage is applied to the electromechanical transducer 25 a predetermined number of times and threshold value preserved in the memory 73. When change quantity is smaller than threshold value, the system controller 62 outputs, to the modulator 85 of the servo circuit 80, a switching signal for increasing drive voltage of the electromechanical transducer 25 as shown in FIG. 5 or for elongating period in which drive voltage is applied as shown in FIG. 6. When change quantity of address information when drive voltage is applied to the electromechanical transducer 25 a predetermined number of times is above threshold value preserved in the memory, the system controller 62 outputs a switching signal for generating drive signal at the time of steady state to the modulator 85 of the servo circuit 80.

The case where tracking error signal is used to carry out this switching will be explained. The system controller 62 preserves, as threshold value, change quantity of tracking error signal when drive voltage is applied to the electromechanical transducer 25 a predetermined number of times, e.g., twice to three times at the time of steady state. The system controller 62 is supplied with a tracking error signal from the RF amplifier 51 at the time of starting to detect change quantity of tracking error signal when drive voltage is applied to the electromechanical transducer 25 a predetermined number of times. The system controller 62 compares change quantity of tracking error signal when drive voltage is applied to the electromechanical transducer 25 a predetermined number of times and threshold value preserved in the memory. When change quantity is smaller than threshold value, the system controller 62 outputs, to the modulator 85 of the servo circuit 80, a switching signal for increasing drive voltage of the electromechanical transducer 25 as shown in FIG. 5 or for elongating period in which drive voltage is applied as shown in FIG. 6. When change quantity of tracking error signal when drive voltage is applied to the electromechanical transducer 25 a predetermined number of times is more than threshold value preserved in the memory, the system controller 62 outputs, to the modulator 85 of the servo circuit 80, a switching signal for generating drive signal at the time of steady state.

The system controller 62 obtains, e.g., sensor information of temperature from the sensor 71 for judging the environment where the apparatus is exposed. In the case where temperature that sensor information obtained from this sensor 71 indicates is out of the range of temperature preserved in the memory 73 as steady value, there is conducted a control for carrying out switching between control of the impact drive mechanism 9 at the time of starting of access of the magneto-optical disc 3 and control at the time of steady state thereof as shown in FIGS. 5A, 5B and FIGS. 6A, 6B. For example, in the case where it is judged from temperature information obtained from the sensor 71 that the apparatus is exposed to temperature lower than the temperature range which is caused to be steady value, voltage value of drive pulses of a predetermined number of times at the time of starting is caused to be larger than that at the time of steady state, thereby making it possible to carry out stable starting operation.

It is to be noted that while the case where voltage value of drive pulse at the time of starting is changed is explained here, there may be also employed such an approach that repetitive period of drive pulse is changed so that stable starting operation is carried out.

Since the system controller 62 carries out a control to turn power supply of the apparatus in OFF state, time when control of power OFF is carried out is obtained from the timer 72 to store it into the memory 73. Thereafter, when power is turned ON for a second time, current time is obtained from the timer 72 to thereby have ability to recognize time period during which power is turned OFF from difference between the current time and time when power is in OFF state stored in the memory 73. In the case where this time period during which power is in OFF state is above a predetermined passing time stored in the memory 73, since the apparatus is not used for a long time period, it is conceivable that even if a steady drive signal is applied to the electromechanical transducer 25 at the time of starting, an operation like that at the time of steady state is not carried out. In view of the above, in such cases that power of the apparatus is in OFF state for more than predetermined time period, voltage value of drive pulses of a predetermined number of times at the time of starting is caused to be larger than steady value to thereby have ability to carry out stable starting operation.

It is to be noted that while the case where voltage value of drive pulse at the time of starting is changed has been explained here, there may be employed an approach to change repetitive period of drive pulse so that stable operation is carried out.

Then, the operation of the disc recording/reproducing apparatus 1 constituted as described above will be explained.

In order to carry out recording/reproduction of information signals by using the disc recording/reproducing apparatus 1 to which the present invention is applied, disc cartridge 2 is loaded into this apparatus. In order to load the disc cartridge 2, cover body rotatably attached to the apparatus body constituting the disc recording/reproducing apparatus 1 is rotationally operated to open the loading portion constituted within the apparatus body. Then, the disc cartridge 2 is loaded into the apparatus body where the loading portion has been opened. At this time, as shown in FIG. 1, the disc cartridge 2 is inserted into the apparatus body with one side surface portion perpendicular to the front face portion where shutter member 5 is provided being as insertion end. It is to be noted that the disc cartridge 2 is inserted and held with respect to cartridge holder rotated in a manner interlocking with the cover body. When the disc cartridge 2 is inserted into the cartridge holder, shutter lock is released by shutter opening piece provided at the cartridge holder. As a result, the shutter member 5 is slid along the front surface portion of cartridge body 2c to open opening portions 4a, 4b provided at cartridge body 2c to face the signal recording area of the magneto-optical disc 3 to the external of the cartridge body 2c in a manner extending over inner and outer circumference.

When the cover body which has been rotated in the state where the inside of the apparatus body has been opened is caused to undergo rotational operation in a direction to close the inside of the apparatus body, the disc cartridge 2 held at the cartridge holder is loaded into the loading portion constituted at the base 10. Thus, the disc table which constitutes the disc rotational drive mechanism 6 is admitted from the opening portion provided at the central portion of the lower half 2b side of the cartridge body 2c into the inside. The disc table is engaged with the central hole provided at the central portion of the magneto-optical disc 3, and magnetically attracts the clamping plate attached in a manner to cover this central hole to thereby clamp the magneto-optical disc 3 so that it can be rotated in one body therewith.

Then, the case where information signals are recorded onto the magneto-optical disc 3 of the disc cartridge 2 loaded at the loading unit will be explained.

In order to record information signals onto the magnet-optical disc 3, recording start button which constitutes the operation unit 60 is first operated by user as shown in FIG. 7 to input recording start signal to the system controller 62. When the recording start signal is inputted, the system controller 62 outputs this recording start signal to the control circuit unit 53. When the recording start signal is inputted, the control circuit unit 53 delivers control signal to the driver 52 to drive the spindle motor 12. When the spindle motor 12 is driven, the disc table and the magneto-optical disc 3 loaded into this disc table are rotated in one body. When rotation of the spindle motor 12 is started, semiconductor laser provided at the optical pick-up 14 is driven to emit light beams at output level for data recording.

When recording start signal is inputted, the control circuit unit 53 drives the impact drive mechanism 9 to move the optical pick-up 14 toward the inner circumferential side of the magneto-optical disc 3. At this time, the control circuit unit 53 allows the object lens to undergo drive displacement in the focus direction in parallel to the optical axis thereof in accordance with focus error signal to carry out focus a control to conduct a control so that the in-focus point of light beams converged by the object lens is positioned on the signal recording surface of the magneto-optical disc 3.

At the time point when focus control of the object lens is carried out, the optical pick-up 14 reads out information, etc. indicating recording position of information signals recorded in TOC (Table of Contents) area provided at the inner circumferential side of the magneto-optical disc 3. Namely, the optical pick-up 14 receives, by light detector, return light beams irradiated onto the magneto-optical disc 3 and reflected from this magneto-optical disc 3 to convert it into an electric signal to deliver the electric signal to the RF amplifier 51. The RF amplifier 51 amplifies the signal which has been detected by the light detector to output it to the address decoder 63. The address decoder 63 decodes the address information which has been read out from the TOC area of the magneto-optical disc 3 thereafter to output the decoded address information to the system controller 62 so that the system controller 62 can specify recording position. When the system controller 62 specifies recording position of recording information, it drives the head vertical movement mechanism to allow the magnetic head 15 to become close to the magneto-optical disc 3. At this time, the semiconductor laser is controlled in a manner to output light beams by power by which recording of information signals can be carried out.

Recording of information signals onto the magneto-optical disc 3 is carried out by irradiating light beams emitted from the semiconductor laser onto the signal recording layer of the magneto-optical disc 3 by power by which recording of information signals can be carried out to heat the area to which light beams have been irradiated of the signal recording layer so that temperature becomes equal to Curie temperature or more and to apply magnetic field modulated in accordance with signal to be recorded from the magnetic head 15 to this heated area.

Figure 8:
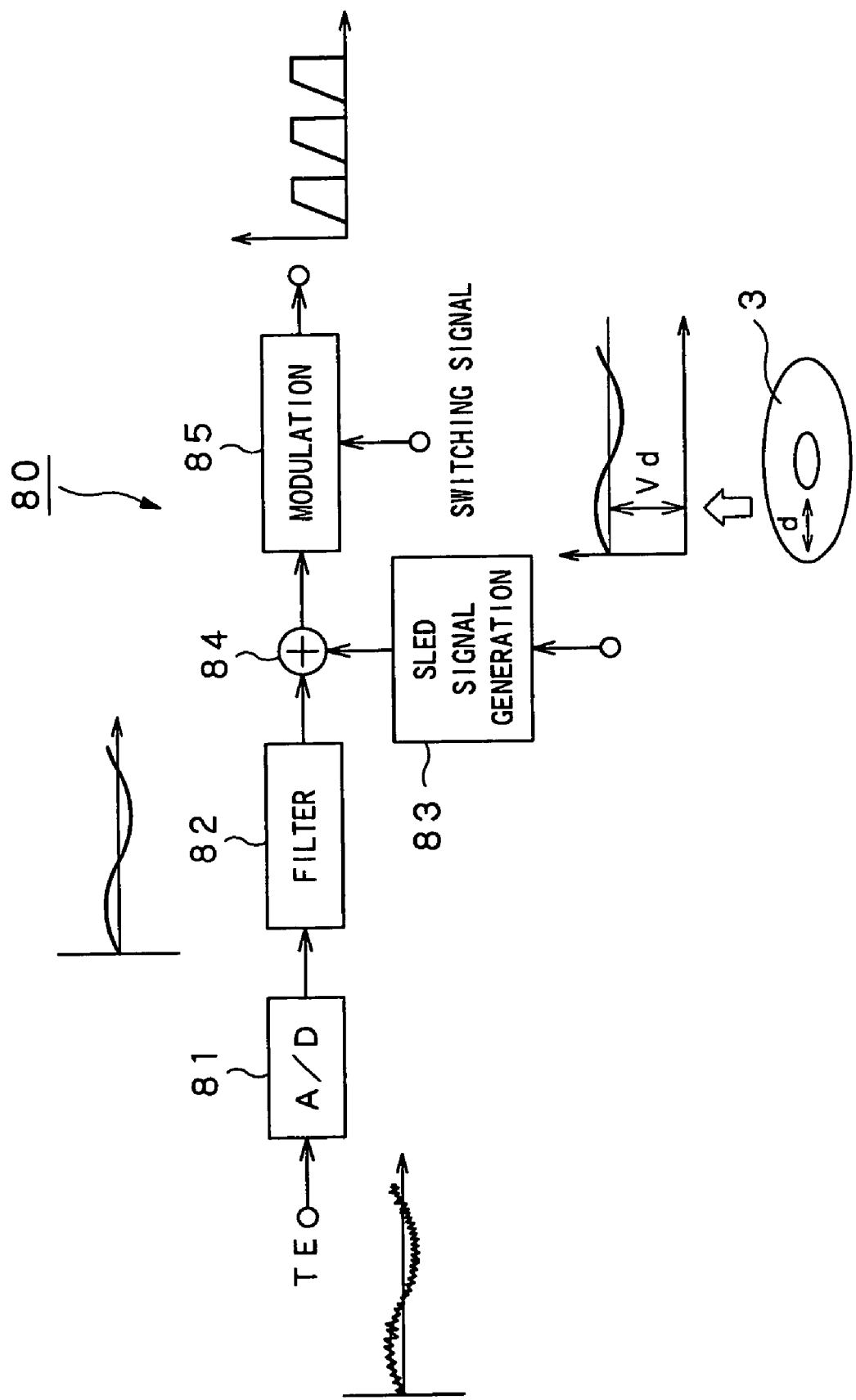
FIG. 8 is a block circuit diagram showing servo circuit used in disc reproducing apparatus to which the present invention is applied.
Figure 9:
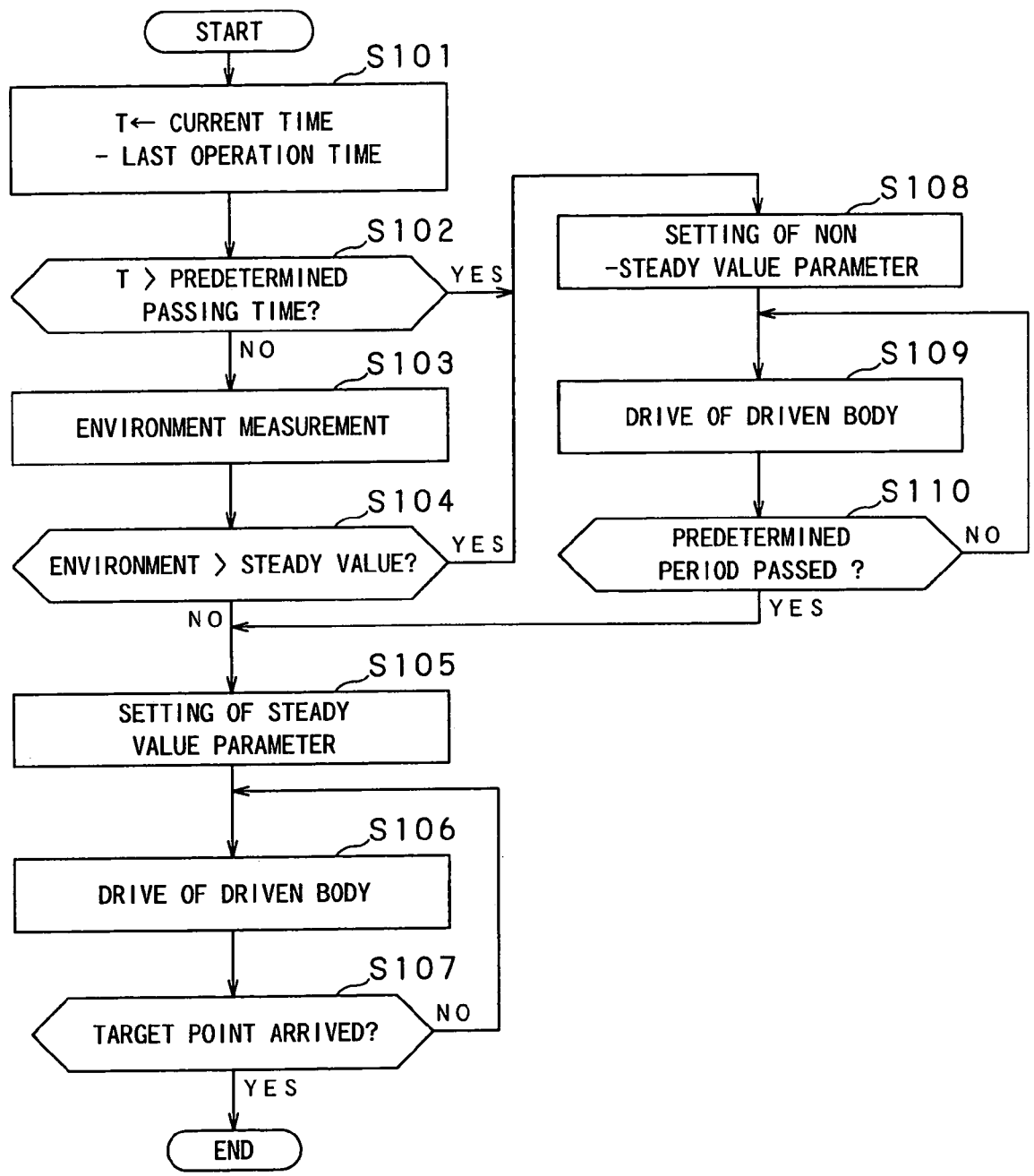
FIG. 9 is a flowchart for explaining the procedure in the case where optical pick-up is transferred to a predetermined track in the disc reproducing apparatus to which the present invention is applied.

When recording operation of information signals onto the magneto-optical disc 3 is started, friction force between the drive shaft 24 and the connecting portion 27 which constitute the impact drive mechanism 9 is large as described above. Therefore, there are instances where the optical pick-up 14 cannot be smoothly moved. In view of the above, when the system controller 62 carries out track jump or tracking control, it allows drive voltage of the electromechanical transducer 25 to be higher than that at the time of steady state as shown in FIG. 5, or allows period of drive voltage to be longer than that at the time of steady state as shown in FIG. 6 from the movement start time of the optical pick-up 14 to move the optical pick-up 14 in the radial direction of the magneto-optical disc 3. Namely, as shown in FIG. 8, the sled signal generator 83 generates sled signal Vd in accordance with control signal from the system controller 62. When tracking error signal is inputted from the RF amplifier 51, the A/D converter 81 converts tracking error signal from analog signal to digital signal. The LPF 82 removes noise of high frequency component of tracking error signal and carries out phase compensation. The adder 84 adds sled signal Vd to the tracking error signal from which high frequency component has been removed to output it to the modulator 85. The modulator 85 generates a drive signal such that tracking error signal becomes equal to zero and drive voltage is caused to be higher than that at the time of steady state or period is caused to be longer than that at the time of steady state in accordance with sum signal in which sled signal vd is added to tracking error signal and switching signal inputted from the system controller 62 to output it to the driver 52. Thus, the impact drive mechanism 9 gently moves, along with the drive shaft 24, the supporting base 19 for supporting the optical pick-up 14 and the magnetic head 15 at the inclination (gradient) portion of drive voltage to rapidly move the drive shaft 24 at the vertical portion of drive voltage to thereby slide the supporting base 19 against friction force. The impact drive mechanism 9 allows the optical pick-up 14 to undergo very small drive so that tracking control of the object lens 16 is carried out to further carry out feed operation to greatly move the optical pick-up 14 in the traversing direction of recording track of the magneto-optical disc 3. At this time, the control circuit unit 53 allows drive voltage V of the electromechanical transducer 25 to be higher than that at the time of steady state as shown in FIG. 5, or allows period of drive voltage V to be longer than that at the time of steady state as shown in FIG. 6 to move the optical pick-up 14 in the radial direction of the magneto-optical disc 3. From this fact, even when friction force between the drive shaft 24 and the connecting portion 27 is large, it is possible to smoothly move the optical pick-up 14 to precisely carry out feed operation or tracking control of the optical pick-up 14.

At the time of the ordinary control where track jump greatly moving between recording tracks formed at the magneto-optical disc 3 is not carried out, sled signal that the sled signal generator 83 generates is equal to zero. When tracking error signal is inputted from the RF amplifier 51, the A/D converter 81 converts tracking error signal from analog signal to digital signal. The LPF 82 removes noise of high frequency component of tracking error signal and carries out phase compensation to output this signal to the modulator 85 through the adder 84. The modulator 85 generates a drive signal in which tracking error signal becomes equal to zero and drive voltage is caused to be higher than that at the time of steady state or period is caused to be longer than that at the time of steady state in accordance with tracking error signal and switching signal inputted from the system controller 62 to output this drive signal to the driver 52. Thus, the impact drive mechanism 9 gently moves, along with the drive shaft 24, the supporting base 19 which supports the optical pick-up 14 and the magnetic head 15 at the inclination (gradient) portion of drive voltage, and rapidly moves the drive shaft 24 at the vertical portion of drive voltage to thereby slide the supporting base 19 against friction force. The impact drive mechanism 9 carries out fine tracking control of the object lens 16 with respect to the optical pick-up 14. At this time, the control circuit unit 53 allows drive voltage V of the electromechanical transducer 25 to be higher than that at the time of steady state as shown in FIG. 5, or allows period of drive voltage V to be longer than that at the time of steady state as shown in FIG. 6 to move the optical pick-up 14 in the radial direction of the magneto-optical disc 3. From this fact, even when friction force between the drive shaft 24 and the connecting portion 27 is large, it is possible to smoothly move the optical pick-up 14 to precisely carry out tracking control.

The system controller 62 preserves, as threshold value, change quantity of address information when drive voltage is applied to the electromechanical transducer 25 a predetermined number of times, e.g., twice or three times at the time of steady state into the memory. Simultaneously therewith, the system controller 62 detects change quantity of address information when drive voltage is applied to the electromechanical transducer 25 a predetermined number of times on the basis of address information inputted from the address decoder 63. The system controller 62 compares change quantity of address information when drive voltage is applied to the electromechanical transducer 25 a predetermined number of times and threshold value preserved in the memory. When change quantity of address information when drive voltage is applied to the electromechanical transducer 25 a predetermined number of times is more than threshold value preserved in the memory 73, the system controller 62 outputs, to the modulator 85 of the servo circuit 80, a switching signal for generating a drive signal at the time of steady state.

The system controller 62 preserves, as threshold value, into the memory 73, change quantity of tracking error signal when drive voltage is applied to the electromechanical transducer 25 a predetermined number of times, e.g., twice or three times at the time of steady state. Simultaneously therewith, the system controller 62 detects change quantity of tracking error signal when drive voltage is applied to the electromechanical transducer 25 a predetermined number of times on the basis of tracking error signal inputted from the RF amplifier 51. The system controller 62 compares change quantity of tracking error signal when drive voltage is applied to the electromechanical transducer 25 a predetermined number of times and threshold value preserved in the memory. When change quantity of tracking error signal when drive voltage is applied to the electromechanical transducer 25 a predetermined number of times is more than threshold value preserved in the memory 73, the system controller 62 outputs, to the modulator 85 of the servo circuit 80, a switching signal for generating a drive signal at the time of steady state.

As shown in FIG. 8, when track jump and/or tracking control are carried out, the modulator 85 generates a drive signal such that tracking error signal becomes equal to zero in accordance with a sum signal in which sled signal Vd is added to tracking error signal and a switching signal inputted from the system controller 62 to output this drive signal to the driver 52. Namely, the modulator 85 lowers drive voltage down to drive voltage at the time of steady state as shown in FIG. 5 or elongates the period of drive voltage into period at the time of steady state as shown in FIG. 6 to generate a drive signal as shown in FIG. 4. Thus, the impact drive mechanism 9 gently moves, along with the drive shaft 24, the supporting base 19 which supports the optical pick-up 14 and the magnetic head 15 at the inclination (gradient) portion of drive voltage, and rapidly moves the drive shaft 24 at the vertical portion of drive voltage to thereby slide the supporting base 19 against friction force. Further, with respect to the optical pick-up 14, the impact drive mechanism 9 can carry out fine tracking control of the object lens 16 and rough feed operation in the radial direction of the magneto-optical disc 3 with respect thereto.

At the time of the ordinary control where track jump is not carried out, the modulator 85 generates a drive signal such that tracking error signal becomes equal to zero and drive voltage is caused to be higher than at the time of steady state or period is caused to be longer than that at the time of ordinary state in accordance with tracking error signal and switching signal inputted from the system controller 62 to output this drive signal to the driver 52. Thus, the impact drive mechanism 9 carries out fine tracking control of the object lens 16 with respect to the optical pick-up 14.

When recording data to be recorded onto the magneto-optical disc 3 is analog signal, that recording data is converted into digital audio signal by the A/D converter 56. When such recording data is digital signal, that recording data is inputted from digital input terminal 70 through the digital interface 57. Thereafter, the recording data of the digital signal is compressed by the ATRAC system at the voice compression encoder/decoder 66, and is temporarily written into the buffer memory 58 by the vibration proof memory controller 65. Such recording data is read out every predetermined data unit from this buffer memory 58. The recording data which has been read out in this way is caused to undergo encode processing such as EFM and CIRC, etc. relating to error correction at the EFM/CIRC encoder/decoder 64, and is then delivered to the head drive circuit 59. The head drive circuit 59 allows the magnetic head 15 to generate external magnetic field modulated in accordance with recording data. Further, the magnetic head 15 applies external magnetic field to the position where light beams are irradiated by the optical pick-up 14 so that temperature is more than Curie temperature to record data.

Then, the operation when reproduction of information signals recorded on the magnet-optical disc 3 of the disc cartridge 2 is carried out will be explained.

In order to carry out reproduction of information signals recorded on the magneto-optical disc 3, similarly to the case where information signals are recorded onto the above-described magneto-optical disc 3, disc cartridge where the magnet-optical disc 3 on which information have been recorded in advance is accommodated is loaded into the recording/reproducing apparatus 1.

At the time point when the disc cartridge is loaded into the recording/reproducing apparatus 1, when reproduction start button of the operation unit 60 is operated by user, reproduction start signal is inputted to the system controller 62. When the reproduction start signal is inputted, the system controller 62 outputs this reproduction start signal to the control circuit unit 53.

It is to be noted that since the operation of the control circuit unit 53 at the time of reproduction is substantially the same as that at the time of recording, the detail is omitted, but since it is unnecessary to apply magnetic field to the magneto-optical disc 3 at the time of reproduction, the magnetic head 15 is held at the position spaced from the magneto-optical disc 3 by the head vertical movement mechanism.

Also when reproduction of information signals recorded on the magneto-optical disc 3 is carried out, address data, etc. recorded in the TOC area of the magneto-optical disc 3 is read out, and recording track where a desired information signal is recorded is designated. Thus, information signals can be reproduced from that designated position.

When reproduction start signal is inputted, the control circuit unit 53 drives the optical pick-up 14 to emit light beams from semiconductor laser. At this time, the semiconductor laser emits light beams for reproduction of which power is smaller than that at the time of recording.

Light beams which have been emitted from the semiconductor laser are converged through the object lens, and are irradiated onto the signal recording surface of the magneto-optical disc 3. The light beams which have been irradiated onto the magneto-optical disc 3 are reflected from the signal recording surface of the magneto-optical disc 3 so that there result return light beams. The light beams thus obtained are incident into the optical pick-up 14 through the object lens, and are detected by light detector. The light beams thus detected are converted into an electric signal. Thus, the electric signal is outputted. A detection signal outputted from the light detector is inputted to the EFM/CIRC encoder/decoder 64 through the RF amplifier 51, at which EFM is carried out, and decode processing such as CIRC, etc. relating to error correction is implemented. The data which has been outputted from the EFM/CIRC encoder/decoder 64 is written into the buffer memory 58 by the vibration proof memory controller 65. The data which has been temporarily written into the buffer memory 58 is read out every predetermined data unit, and is delivered to the voice compression encoder/decoder 66. The data thus obtained is caused to undergo decode processing by the ATRAC system so that it is expanded. The expanded digital data is converted into analog audio signal by the D/A converter 55. The analog audio data thus obtained is then outputted from speaker, earphone and/or headphone, etc. connected to audio output terminal 67. In addition, digital audio signal is directly outputted from the digital output terminal 69 through the digital interface 57.

The procedure in the case where the system controller 62 transfers the optical pick-up 14 to a predetermined recording track in the disc recording/reproducing apparatus 1 constituted as described above will be explained.

In order to carry out this operation, at step S101, time period T during which power is in OFF state is calculated on the basis of the time when power supply of the apparatus is last turned OFF and current time which is read out from the timer 72 which are held in the memory 73.

At step S102, the calculated power OFF time period T and a predetermined passage time period preserved in the memory 73 are compared with each other to judge whether or not power OFF time period T of the apparatus is the time period where there is high possibility that steady operation is not carried out at the time of starting.

In the case where it is judged at the step S102 that time period of power OFF of the apparatus is shorter than a predetermined time, measurement of the environment where the apparatus is exposed is carried out from the sensor 71 at step S103 to obtain that data. For example, temperature of the apparatus or temperature of the environment where the apparatus is exposed is measured. It is to be noted that it is needless to say that it is desirable that the sensor 71 is attached in the vicinity of the electromechanical transducer 25, and temperature and/or humidity at the portion in the vicinity of the electromechanical transducer 25 can be measured.

At the step S103, whether or not the observed environmental data is above the steady value range held in the memory 73 is judged.

In the case where it is discriminated at step S104 that the environmental data falls within the range of the steady value, information for generating a drive signal applied to the electromechanical transducer 25 at the time of steady operation is preserved into the memory 73 at the time of steady operation at step S105.

At step S106, drive signal is applied to the electromechanical transducer 25 on the basis of parameter value for generating a drive signal for driving the electromechanical transducer 25 held in the memory 73 to conduct a control such that the optical pick-up 14 is shifted in a predetermined direction.

At step S107, whether or not the optical pick-up 14 reaches the position in the vicinity of the target point to be shifted is judged on the basis of, e.g., address signal on the magneto-optical disc which has been read out from the optical pick-up 14. At this time, in the case where it is judged that the optical pick-up 14 does not reach the position in the vicinity of the target point, processing returns to the step S106. Further, drive signal is applied on the basis of parameter at the time of steady state to the electromechanical transducer 25.

In the case where it is judged at the step S107 that the optical pick-up 14 reaches the portion in the vicinity of the target point, transfer operation of the optical pick-up 14 is completed.

In the case where it is judged at the step S102 that power supply of the apparatus has been placed in OFF state for more than predetermined time, processing of step S108 is executed.

In the case where it is judged at the step S104 that the environmental data is above the steady value range, e.g., in the case where the environmental humidity of the electromechanical transducer 25 is higher than steady value, or in the case where such environmental humidity is lower than the steady value, processing of the step S108 is executed.

Processing of the step S108 corresponds to processing at the time of non-steady state, i.e., corresponds to the case where it is judged that there is the possibility that the operation cannot be securely carried out by signal similar to the drive signal for driving the electromechanical transducer 25 at the time of steady state. Accordingly, data is held into the memory 73 so that a signal different from a drive signal for driving the electromechanical transducer 25 at the time of steady state is applied to the electromechanical transducer 25.

At step S109, a drive signal at the time of non-steady state of the electromechanical transducer 25 is applied on the basis of parameter at the time of non-steady state which is held in the memory 73.

At step S110, whether or not drive signal generated on the basis of parameter at the time of non-steady state to the electromechanical transducer 25 is applied for a predetermined time period is discriminated. This can be discriminated from, e.g., the number of pulses of drive signal or measurement result of transfer speed of the optical pick-up 14, etc.

In the case where it is discriminated at the step S110 that the optical pick-up 14 does not reach for a predetermined time period, processing returns to the step S109. Thus, drive of driven body, i.e., transfer operation with respect to the optical pick-up 14 by application of drive signal to the electromechanical transducer 25 is continuously carried out.

In the case where it is judged at the step S110 that application of drive signal of the electromechanical transducer 25 produced by parameter at the time of non-steady state is carried out for a predetermined time period, processing proceeds to the step S105. Thus, transfer of the optical pick-up 14 in the steady state is carried out.

In the disc recording/reproducing apparatus 1 constituted as described above, the above-described impact drive mechanism 9 is used, thereby making it possible to reduce the number of parts to much extent as compared to the mechanism for converting rotational drive by the drive motor into linear drive through a group of gears and rack member as in the case of the prior art to realize further miniaturization and lightening. In this disc recording/reproducing apparatus 1, since the above-described recording/reproducing mechanism 7 and the impact drive mechanism 9 are disposed within the area S where opening portions 4a, 4b for recording/reproduction are projected of the disc cartridge 2, a portion of the recording/reproducing mechanism 7 and the impact drive mechanism 9 can be disposed at the inside of the disc cartridge 2 through the opening portions 4a, 4b for recording/reproduction. Thus, thinner structure and further miniaturization can be realized. Further, in the disc recording/reproducing apparatus 1, the supporting base 19 is moved by the impact drive mechanism 9 to thereby have ability to carry out tracking control and feed operation of the optical pick-up 14. As a result, it becomes unnecessary to provide coils and/or magnets for tracking control for the object lens drive mechanism of the optical pick-up 14. Thus, simplicity and miniaturization of the configuration can be realized. In this disc recording/reproducing apparatus 1, it is unnecessary to provide screw serving as screw portion for drive at the above-described guide shaft 20. Thus, this guide shaft 20 can be formed to be thin. Accordingly, this guide shaft 20 can be also disposed within the area S where opening portions 4a, 4b for recording/reproduction are projected of the above-described disc cartridge 2. Thus, further miniaturization can be made. In addition, in this disc recording/reproducing apparatus 1, it is unnecessary to carry out correction of detection signal in which offset by visual field waving of the object lens 16 as in the prior art is taken into consideration. Thus, it is possible to easily apply tracking servo by 1 spot optical system. Accordingly, in this recording/reproducing apparatus 1, it is possible to simplify mechanism for carrying out the above-described tracking operation, etc. Thus, reliability can be greatly improved.

In the disc recording/reproducing apparatus 1 according to the present invention, when friction force is large at the time of starting, etc., drive voltage applied to the electromechanical transducer 25 is caused to be high, or the period is caused to be long to thereby increase movement quantity of the supporting base 19 which supports the optical pick-up 14 or the magnetic head 15, i.e., increase drive force for driving the supporting base 19, thereby making it possible to smoothly move the supporting base 19.

It is to be noted that while the example where feed operation of the optical pick-up 14 and tracking control of the object lens 16 are carried out by the impact drive mechanism 9 and the object lens drive mechanism of the optical pick-up 14 is constituted by the uni-axial actuator which carries out only focusing control has been explained in the above-described example, the present invention is not limited to such implementation, but there may be employed an approach such that only feed operation of the optical pick-up 14 is carried out by the impact drive mechanism 9, and the object lens drive mechanism of the optical pick-up 14 is constituted by the biaxial actuator which is the same as the prior art so that focusing control and tracking control can be carried out.

While the invention has been described in accordance with certain preferred embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by the appended claims.

INDUSTRIAL APPLICABILITY

As described above, in accordance with the present invention, when friction force is large at the time of starting, etc., drive voltage applied to the electromechanical transducer is caused to be higher than that at the time of steady state, or the period is caused to be longer, thereby making it possible to smoothly move recording and/or reproducing unit which serves as driven body.

The invention claimed is:

1. A drive device comprising:
   a drive shaft;
   electromechanical transducing means attached to one end of the drive shaft, and adapted to be expanded and contracted in the axial direction of the drive shaft by a drive voltage applied thereto to thereby allow the drive shaft to undergo displacement in the axial direction of the drive shaft;
   a driven body supported in the state where it is movably friction-engaged in the axial direction of the drive shaft; and
   control means for controlling the drive voltage so that speeds of expansion and contraction of the electromechanical transducing means are caused to be different from each other to move the driven body in the axial direction of the drive shaft,
   wherein control is carried out such that the drive voltage is caused to be different from that at steady movement time of the driven body for a predetermined time period from the time when the driven body is in stop state.

2. The drive device as set forth in claim 1,
   wherein the electromechanical transducing means is driven by drive voltage of which absolute value is greater than drive voltage at the time of steady state for a predetermined time period from the time when the driven body is in stop state.

3. The drive device as set froth in claim 1,
   wherein the electromechanical transducing means is driven by drive voltage of which period is longer than repetitive period of drive voltage at the time of steady state for a predetermined time period from the time when the driven body is in stop state.

4. A reproducing apparatus comprising:
   rotation drive means for rotationally driving a disc-shaped recording medium;
   reproducing means for reproducing information signals recorded on the disc-shaped recording medium rotated by the rotation drive means;
   movement supporting means for movably supporting the reproducing means in the radial direction of the disc-shaped recording medium;
   a drive shaft disposed along the radial direction of the disc-shaped recording medium;
   electromechanical transducing means attached to one end of the drive shaft, and adapted to be expanded and contracted in the axial direction of the drive shaft by a drive signal applied thereto to thereby allow the drive shaft to undergo displacement in the axial direction of the drive shaft;
   friction engagement means which is movably friction-engaged in the axial direction of the drive shaft and attached to the reproducing means; and
   control means for controlling the drive signal so that speeds of expansion and contraction of the electromechanical transducing means are caused to be different from each other to move the reproducing means in the axil direction of the drive shaft,
   wherein control is conducted in such a manner that the drive signal is caused to be different from that at steady movement time of the reproducing means for a predetermined time period from the time when the reproducing means is in stop state.

5. The reproducing apparatus as set forth in claim 4,
   wherein the electromechanical transducing means is driven by drive voltage of which absolute value is larger than drive voltage of a drive signal at the time of steady state for a predetermined time period from the time when the reproducing means is in stop state.

6. The reproducing apparatus as set forth in claim 4,
   wherein the electromechanical transducing means is driven by a drive signal of which period is longer than repetitive period of a drive signal at the time of steady state for a predetermined time period from the time when the reproducing means is in stop state.

7. The reproducing apparatus as set forth in claim 4,
   wherein control is conducted in such a manner that the drive signal is caused to be different from that at steady movement time of the reproducing means on the basis of movement quantity of a tracking error signal that the reproducing means has detected.

8. The reproducing apparatus as set forth in claim 4,
   wherein the reproducing apparatus further comprises environment measuring means for measuring environment in the vicinity of the drive shaft, and
   wherein the control means conducts a control on the basis of environment information obtained from the environment measuring means in such a manner that the drive signal is caused to be different from that at steady movement time of the reproducing means for a predetermined time period from the time when the reproducing means is in stop state.

9. The reproducing apparatus as set forth in claim 4,
   wherein the reproducing apparatus further comprises time clock means, and
   wherein the control means conducts a control on the basis of power OFF time period of the apparatus measured by the time clock means so that the drive signal is caused to be different from that at steady movement time of the reproducing means for a predetermined time period from the time when the reproducing means is in stop state.

10. A drive method for a driven body in which a drive shaft, electromechanical transducing means attached to one end of the drive shaft and adapted to be expanded and contracted in the axial direction of the drive shaft by a drive signal applied thereto to thereby allow the drive shaft to undergo displacement in the axial direction of the drive shaft, and a driven body supported in the state where it is movably friction-engaged in the axial direction of the drive shaft are provided to control the drive signal so that speeds of expansion and contraction of the electromechanical transducing means are caused to be different from each other to move the driven body in the axial direction of the drive shaft,
    the drive method comprising:
    applying a start time drive signal different from that at the steady drive time to the electromechanical transducing means when the driven body is in stop state; and
    applying the start time drive signal to the electromechanical transducing means for a predetermined time period thereafter to apply a steady drive signal to the electromechanical transducing means.

11. A reproducing method in which rotation drive means for rotationally driving a disc-shaped recording medium, reproducing means for reproducing information signals recorded on the disc-shaped recording medium rotated by the rotation drive means, movement supporting means for movably supporting the reproducing means in the radial direction of the disc-shaped recording medium, a drive shaft disposed along the radial direction of the disc-shaped recording medium, electromechanical transducing means attached to one end of the drive shaft and adapted to be expanded and contracted in the axial direction of the drive shaft by a drive signal applied thereto to thereby allow the drive shaft to undergo displacement in the axial direction of the drive shaft, and friction engagement means movably friction-engaged in the axial direction of the drive shaft and attached to the reproducing means are provided to control the drive signal so that speeds of expansion and contraction of the electromechanical transducing means are caused to be different from each other to move the reproducing means in the axial direction of the drive shaft to reproduce information recorded on the disc-shaped recording medium, the reproducing method comprising:

applying a start time drive signal different from that at a steady transfer time to the electromechanical transducing means at the time of start of transfer of the reproducing means; and stopping application to the electromechanical transducing means of the steady drive signal in the case where the reproducing means is transferred to the portion in the vicinity of a predetermined transfer destination.

* * * * *

UNITED STATES PATENT AND TRADEMARK OFFICE
CERTIFICATE OF CORRECTION

PATENT NO.         : 7,184,371 B2                                                           Page 1 of 1
APPLICATION NO. : 10/467060
DATED              : February 27, 2007
INVENTOR(S)        : Kazuhito Kurita et al.

It is certified that error appears in the above-identified patent and that said Letters Patent is hereby corrected as shown below:

Column 9, line 18, change "piezoelectric" to --piezo-electric--.

Signed and Sealed this

Third Day of July, 2007

JON W. DUDAS
*Director of the United States Patent and Trademark Office*